(12) United States Patent
Naiki et al.

(10) Patent No.: US 12,302,061 B2
(45) Date of Patent: May 13, 2025

(54) TRANSDUCER

(71) Applicant: ROHM CO., LTD., Kyoto (JP)

(72) Inventors: Takashi Naiki, Kyoto (JP); Takaya Nagahata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 498 days.

(21) Appl. No.: 17/689,577

(22) Filed: Mar. 8, 2022

(65) Prior Publication Data

US 2022/0191622 A1    Jun. 16, 2022

Related U.S. Application Data

(63) Continuation of application No. PCT/JP2020/032094, filed on Aug. 26, 2020.

(30) Foreign Application Priority Data

Sep. 13, 2019 (JP) .................................. 2019-166946
Sep. 25, 2019 (JP) .................................. 2019-174030

(51) Int. Cl.
| | |
|---|---|
| H04R 17/00 | (2006.01) |
| H04R 1/02 | (2006.01) |
| H04R 3/00 | (2006.01) |
| H04R 7/10 | (2006.01) |
| H04R 7/18 | (2006.01) |

(52) U.S. Cl.
CPC ............. *H04R 17/00* (2013.01); *H04R 1/025* (2013.01); *H04R 3/00* (2013.01); *H04R 7/10* (2013.01); *H04R 7/18* (2013.01)

(58) Field of Classification Search
CPC .......... H04R 17/00; H04R 1/025; H04R 3/00; H04R 7/10; H04R 7/18
See application file for complete search history.

(56) References Cited

U.S. PATENT DOCUMENTS

| | | | | |
|---|---|---|---|---|
| 5,812,496 | A | * | 9/1998 | Peck ........................ H04R 9/06 |
| | | | | 367/176 |
| 9,302,292 | B2 | * | 4/2016 | Lin ........................ G10K 9/122 |
| 10,848,864 | B2 | * | 11/2020 | Lippert .................... H04R 3/00 |

(Continued)

FOREIGN PATENT DOCUMENTS

| | | |
|---|---|---|
| CN | 101189910 A | 5/2008 |
| CN | 108622842 A | 10/2018 |

(Continued)

OTHER PUBLICATIONS

Chinese Office Action dated Feb. 28, 2025, in the corresponding Chinese Patent Application No. 202080064191.1.

*Primary Examiner* — Olisa Anwah
(74) *Attorney, Agent, or Firm* — Rabin & Berdo, P.C.

(57) ABSTRACT

A transducer includes a piezoelectric element that includes a piezoelectric membrane which is interposed between a pair of electrodes, a membrane body that includes a vibration membrane displaceable in a membrane thickness direction, the piezoelectric element being laminated on the vibration membrane, a package that includes an internal space which houses the piezoelectric element and the membrane body, and an abutment pad that is disposed in the internal space and limits displacement of the vibration membrane by abutting the piezoelectric element or the vibration membrane when the vibration membrane is displaced in the membrane thickness direction.

10 Claims, 26 Drawing Sheets

(56) References Cited

U.S. PATENT DOCUMENTS

| | | | |
|---|---|---|---|
| 2007/0165898 A1* | 7/2007 | Huang | H04R 1/086 381/369 |
| 2009/0309171 A1 | 12/2009 | Schrank | |
| 2011/0108933 A1* | 5/2011 | Nakatani | H04R 19/04 257/E29.324 |
| 2012/0328142 A1 | 12/2012 | Horibe et al. | |
| 2013/0263996 A1 | 10/2013 | Holliday | |
| 2014/0084395 A1* | 3/2014 | Sparks | B81C 1/00158 257/416 |
| 2015/0114555 A1 | 4/2015 | Holliday | |
| 2015/0215706 A1 | 7/2015 | Sparks et al. | |
| 2016/0033349 A1 | 2/2016 | Abed | |
| 2017/0006381 A1* | 1/2017 | Rusconi Clerici | H04R 17/00 |
| 2017/0217761 A1 | 8/2017 | Chung et al. | |
| 2018/0220240 A1* | 8/2018 | Yoo | B81B 3/007 |
| 2018/0317033 A1* | 11/2018 | Zhang | B81B 3/007 |
| 2019/0082261 A1* | 3/2019 | Yoo | H04R 19/005 |
| 2019/0170699 A1 | 6/2019 | Takezaki et al. | |
| 2021/0343925 A1* | 11/2021 | Saito | H10N 30/302 |

FOREIGN PATENT DOCUMENTS

| | | |
|---|---|---|
| JP | S47-037967 A | 12/1972 |
| JP | 2001-268695 A | 9/2001 |
| JP | 2006135264 A | 5/2006 |
| JP | 2009-135661 A | 6/2009 |
| JP | 2009-523341 A | 6/2009 |
| JP | 2012-105170 A | 5/2012 |
| JP | 2013-031146 A | 2/2013 |
| JP | 2015-518646 A | 7/2015 |
| JP | 2015-162710 A | 9/2015 |
| JP | 2017-042871 A | 3/2017 |
| JP | 2017-509860 A | 4/2017 |
| JP | 2018-098546 A | 6/2018 |
| JP | 2018-170592 A | 11/2018 |
| WO | 2017/129958 A1 | 8/2017 |
| WO | 2018/037730 A1 | 3/2018 |

* cited by examiner

TRANSDUCER

CROSS REFERENCE TO RELATED APPLICATIONS AND INCORPORATION BY REFERENCE

This is a continuation application (CA) of PCT Application No. PCT/JP2020/032094, filed on Aug. 26, 2020, which claims priority to Japan Patent Application Nos. P2019-166946 filed on Sep. 13, 2019, and P2019-174030 filed on Sep. 25, 2019 and is based upon and claims the benefit of priority from prior Japanese Patent Application Nos. P2019-166946 filed on Sep. 13, 2019, and P2019-174030 filed on Sep. 25, 2019 and PCT Application No. PCT/JP2020/032094, filed on Aug. 26, 2020, the entire contents of each of which are incorporated herein by reference.

BACKGROUND OF THE INVENTION

1. Field of the Invention

The present disclosure relates to a transducer.

2. Description of the Related Art

Transducers which transmit or receive sound waves or ultrasonic waves are conventionally known. Transducers are used, for example, as speakers for transmitting sound waves and are mounted in earphones, wearable terminals, or the like.

A sound generator suitable for earphones is known. The sound generator includes a coil for generating a magnetic field and a magnet for vibrating a vibration plate by interacting with the magnetic field generated by means of the coil.

A speaker using a coil and a magnet requires a large driving voltage and power consumption becomes large. Therefore, speakers using piezoelectric elements are also attracting attention. A piezoelectric element is constituted by sandwiching a piezoelectric membrane from both sides by a pair of electrodes. A speaker of this kind is manufactured by using MEMS (Micro Electro Mechanical Systems) which is a semiconductor manufacturing technology for realizing microfabrication.

A speaker manufactured by means of MEMS has a very small shape, and therefore the speaker tends to have a fragile structure. Therefore, there is a risk that breakage may occur due to an impact or the like input from the outside.

SUMMARY OF THE INVENTION

An aspect of one or more embodiments provides a transducer that includes: a piezoelectric element that includes a piezoelectric membrane which is interposed between a pair of electrodes; a membrane body that includes a vibration membrane displaceable in a membrane thickness direction, the piezoelectric element being laminated on the vibration membrane; a package that includes an internal space which houses the piezoelectric element and the membrane body; and an abutment member that is disposed in the internal space and limits displacement of the vibration membrane by abutting the piezoelectric element or the vibration membrane when the vibration membrane is displaced in the membrane thickness direction.

Further, an aspect of one or more embodiments provides a transducer that includes: a membrane support portion that includes a cylindrical inner peripheral surface which forms a hollow portion; a vibration membrane that has a whole periphery connected to the inner peripheral surface and is displaceable in a membrane thickness direction; a piezoelectric element that includes a pair of electrodes and a piezoelectric membrane interposed between the pair of electrodes, and is laminated on the vibration membrane; and a dividing slit that penetrates a vibrator in which the vibration membrane and the piezoelectric element are laminated in a thickness direction, and divides the vibrator into a plurality of vibration regions, in which the inner peripheral surface has a polygonal shape in which a plurality of flat portions are connected via a chamfered corner portion, and the dividing slit includes: a main slit portion that extends from a center of the vibration membrane toward the corner portion, and a sub-slit portion that extends from a connecting portion which connects the corner portion and the flat portions, to an end portion of the main slit portion on a side of the corner portion.

Further, an aspect of one or more embodiments provides a transducer that includes: a membrane support portion that includes a cylindrical inner peripheral surface which forms a hollow portion; a vibration membrane that has a whole periphery connected to the inner peripheral surface and is displaceable in a membrane thickness direction; a piezoelectric element that includes a pair of electrodes and a piezoelectric membrane interposed between the pair of electrodes, and is laminated on the vibration membrane; and a dividing slit that penetrates a vibrator in which the vibration membrane and the piezoelectric element are laminated in a thickness direction, and divides the vibrator into a plurality of vibration regions, in which the inner peripheral surface has a polygonal shape in which a plurality of flat portions are connected via a corner portion, the dividing slit extends from the center of the vibration membrane toward the corner portion, and the piezoelectric element includes a piezoelectric slit that penetrates the piezoelectric element in a thickness direction and extends from the flat portions to the dividing slit along a vertical direction of the flat portions.

DETAILED DESCRIPTION OF THE INVENTION

Figure 1:
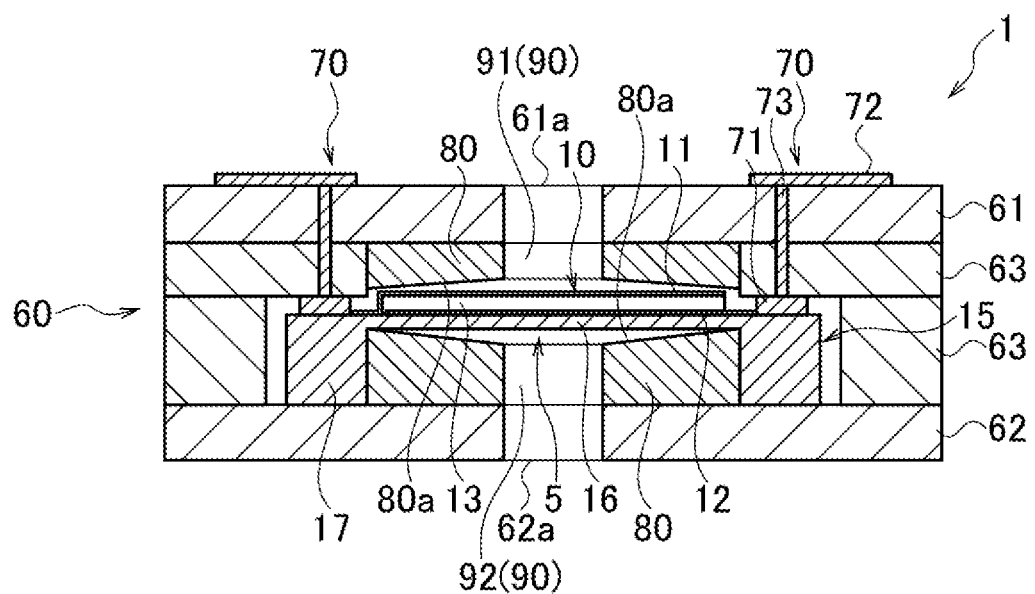
FIG. 1 is a cross-sectional view showing a transducer according to a first embodiment.

Embodiments of the present invention will be described below with reference to the drawings. In the drawings, the same parts are denoted by the same reference numerals, and the description thereof is omitted.

First Embodiment

Figure 2:
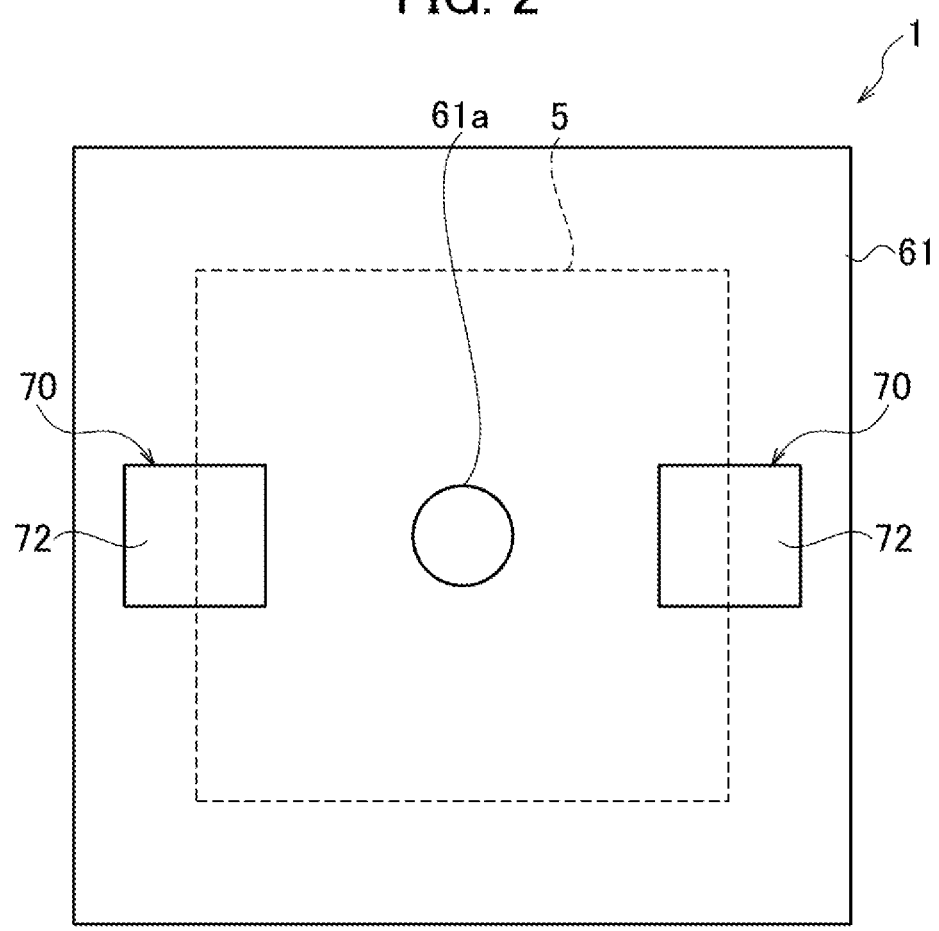
FIG. 2 is a top view showing a transducer according to a first embodiment.

With reference to FIGS. 1 and 2, the configuration of a transducer 1 according to the present embodiment will be described. The transducer 1 according to the present embodiment is mainly formed of a sound chip 5, a package 60, external electrodes 70, and abutment pads 80. In the following description, an up and down direction is defined based on the state of the transducer 1 shown in FIG. 1, but an absolute direction relative to the transducer 1 is not defined.

Figure 3:
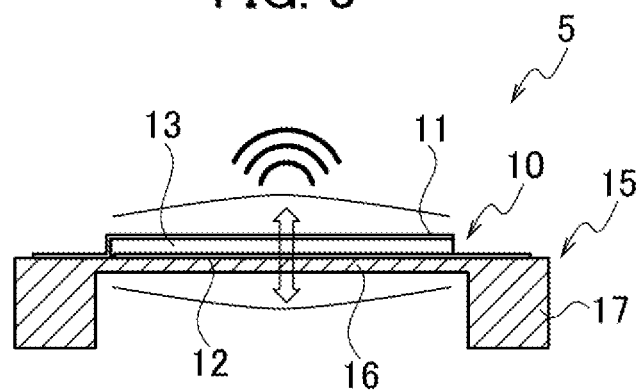
FIG. 3 is a cross-sectional view showing a sound chip according to a first embodiment.
Figure 4:
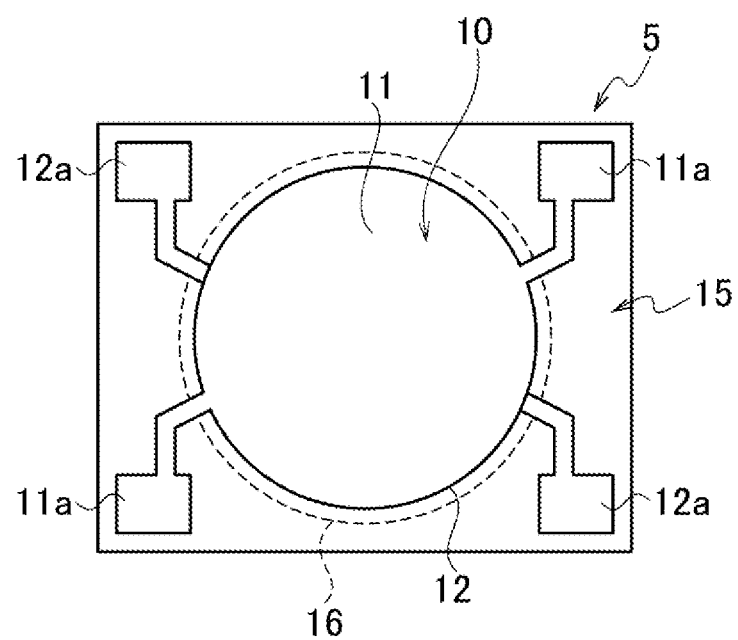
FIG. 4 is a top view showing a sound chip according to a first embodiment.

In FIGS. 3 and 4, the sound chip 5 includes a piezoelectric element 10 and a membrane body 15.

The piezoelectric element 10 includes a pair of electrodes 11 and 12 and a piezoelectric membrane 13 which is interposed between the pair of electrodes 11 and 12. The pair of electrodes 11 and 12 and the piezoelectric membrane 13 have a shape corresponding to the shape of a vibration membrane 16 which will be described later, and have a circular shape in the examples shown in FIGS. 3 and 4.

Each of the electrodes 11 and 12 is formed of a thin membrane of a conductive metal such as aluminum or copper, for example. One of the electrodes 11 and 12, namely the electrode 11, is positioned on the upper side of the piezoelectric membrane 13. The electrode 11 is connected to a pair of electrode pads 11a for applying a driving voltage to the electrode 11. The other of the electrodes 11 and 12, namely the electrode 12, is positioned on the lower side of the piezoelectric membrane 13. The electrode 12 is connected to a pair of electrode pads 12a for applying a driving voltage to the electrode 12. The piezoelectric membrane 13 is composed of, for example, a lead zirconate titanate (PZT) membrane. For the piezoelectric membrane 13, aluminum nitride (AlZ), zinc oxide (ZnO), lead titanate (PbTiO3), or the like can be used in addition to lead zirconate titanate.

The membrane body 15 is composed of the vibration membrane 16 and a membrane support portion 17. The membrane body 15 is made of, for example, silicon (Si). The vibration membrane 16 and the membrane support portion 17 are integrally formed by etching the lower surface side of the membrane body 15.

The vibration membrane 16 is formed of a thin membrane. The vibration membrane 16 is displaceable in the membrane thickness direction, that is, in the direction normal to the vibration membrane 16 (the up and down direction in the page space of FIG. 3 and the direction perpendicular to the plane of FIG. 4). The vibration membrane 16 has a substantially circular shape when viewed in a plane perpendicular to the membrane thickness direction. The vibration membrane 16 may be divided into a plurality of regions by means of a plurality of slits which extend radially from the center of the vibration membrane 16.

The membrane support portion 17 is connected to the vibration membrane 16 along the whole periphery of the vibration membrane 16. The membrane support portion 17 supports the vibration membrane 16. A cylindrical void (cavity) is formed below the vibration membrane 16.

In the sound chip 5 having such a configuration, the piezoelectric element 10 is disposed on the vibration membrane 16 of the membrane body 15. That is, the lower electrode 12, the piezoelectric membrane 13, and the upper electrode 11 are laminated in this order on the vibration membrane 16. When a driving voltage is applied to each of the pair of electrodes 11 and 12, an electric field is generated between the pair of electrodes 11 and 12. The vibration membrane 16 is displaced by this electric field. The vibration membrane 16 can be vibrated by repeatedly changing a driving voltage applied to the pair of electrodes 11 and 12.

In FIGS. 1 and 2, the package 60 is constituted by laminating a plurality of substrates, for example, four substrates 61 to 63. The four substrates 61 to 63 constituting the package 60 are laminated along the membrane thickness direction of the vibration membrane 16.

Specifically, the package 60 includes a substrate (upper substrate) 61 constituting the upper surface of the package 60 and a substrate (lower substrate) 62 constituting the lower surface of the package 60. The package 60 further includes two substrates (intermediate substrates) 63 that are laminated between the upper substrate 61 and the lower substrate 62. The outer periphery of each of the upper substrate 61, the lower substrate 62, and the intermediate substrates 63 is substantially the same in shape and substantially the same in size. In the example shown in FIG. 2, the outer periphery has a square shape. However, the outer periphery of each of the upper substrate 61, the lower substrate 62, and the intermediate substrates 63 may be different in shape or different in size.

In the example shown in FIG. 1, each of the upper substrate 61 and the lower substrate 62 is formed of a single substrate, but instead each of them may be formed of two or more substrates. Further, the intermediate substrates 63 are formed of two substrates, but instead they may be formed of a single substrate or three or more substrates. In addition, although four corner portions of each of the substrates 61 to 63 are right-angled, they may be chamfered in an arc shape or a tapered shape.

A through-hole is formed in each intermediate substrate 63, the through-hole passing thorough each intermediate substrate 63 in the thickness direction of each intermediate substrate 63. The through-holes formed in the two intermediate substrates 63 communicate with each other, and an internal space 90 is formed inside the package 60 by means of the through-holes. The sound chip 5 is housed in the internal space 90 of the package 60 so that the sound chip 5 is mounted in the package 60.

The internal space 90 is divided into an upper space portion 91 and a lower space portion 92 with the vibration membrane 16 as a boundary. The upper space portion 91 is positioned above the vibration membrane 16 and the lower space portion 92 is positioned below the vibration membrane 16. In order to communicate the upper space portion 91 with an external space positioned outside the package 60, an upper through-hole 61a is formed in the upper substrate 61. The upper through-hole 61a passes through the upper substrate 61 in the thickness direction. The upper through-hole 61a faces the piezoelectric element 10 and the vibration membrane 16 with the upper space portion 91 therebetween. Further, in order to communicate the lower space portion 92 with the external space of the package 60, a lower through-hole 62a is formed in the lower substrate 62. The lower through-hole 62a passes through the lower substrate 62 in the thickness direction. The lower through-hole 62a faces the vibration membrane 16 with the lower space portion 92 therebetween.

When a driving voltage applied to the pair of electrodes 11 and 12 is repeatedly changed, the vibration membrane 16 is displaced in the membrane thickness direction. Specifically, the vibration membrane 16 alternately repeats displacement to the upper space portion 91 side and displacement to the lower space portion 92 side, and thus the air in the upper space portion 91 is vibrated. The vibration (sound wave) of the air is output to the outside of the package 60 through the upper through-hole 61a. At this time, the lower through-hole 62a serves to secure the flow of air to the lower space portion 92 and to allow the vibration of the vibration membrane 16.

The external electrodes 70 include chip electrodes 71, module electrodes 72, and electrode wiring 73. The chip electrodes 71 are connected to the electrode pads 11a and 12a of the sound chip 5. The chip electrodes 71 are formed at the upper side of the internal space 90, specifically, on the lower surface of an upper intermediate substrate 63 of the two intermediate substrates 63. Accordingly, the chip electrodes 71 face the electrode pads 11a and 12a of the sound chip 5, which is housed in the internal space 90. The module electrodes 72 are connected to the electrodes 11 and 12 via the chip electrodes 71 and the electrode wiring 73. The module electrodes 72 are formed on the upper surface of the package 60, specifically, on the upper surface of the upper substrate 61. The electrode wiring 73 connects the chip electrodes 71 and the module electrodes 72. Through-holes are formed in the upper substrate 61 and one of the intermediate substrates 63 adjacent to the upper substrate 61, and the through-holes communicate with each other. The electrode wiring 73 is provided in the through-holes. In FIGS. 1 and 2, only a portion of the external electrodes is representatively depicted.

Abutment pads 80 are disposed in both of the upper space portion 91 and the lower space portion 92, and are arranged so as to face the vibration membrane 16. The abutment pads 80 have a function of limiting the displacement of the vibration membrane 16. That is, suppose that the vibration membrane 16 is displaced to the upper space portion 91 side or the lower space portion 92 side. In the above case, the abutment pads limit the displacement of the vibration membrane 16 by abutting the vibration membrane 16 or the piezoelectric element 10 on the vibration membrane 16.

The distance between the vibration membrane 16 and abutment surfaces 80a of the abutment pads 80 that abut the vibration membrane 16 is set based on the displacement of the vibration membrane 16 (hereinafter referred to as the "maximum displacement") when a rated voltage is applied to the piezoelectric element 10. That is, suppose that displacement larger than the maximum displacement occurs. In the above case, the vibration membrane 16 or the piezoelectric element 10 is set to abut the abutment surfaces 80a of the abutment pads 80. Accordingly, the vibration membrane 16 abuts the abutment surfaces 80*a* without preventing the normal displacement of the vibration membrane 16 due to the piezoelectric element 10, when a large displacement exceeding the maximum displacement occurs in the piezoelectric membrane 13 due to an impact or the like.

The shape of the abutment surfaces 80*a* is formed based on the displacement shape when the vibration membrane 16 is displaced. Accordingly, when the vibration membrane 16 abuts the abutment surfaces 80*a*, the abutment surfaces 80*a* support the vibration membrane 16 with the surfaces thereof. The abutment surface 80*a* of the abutment pad 80 disposed in the upper space portion 91 has a hemispherical shape that is curved upward, for example. Similarly, the abutment surface 80*a* of the abutment pad 80 disposed in the lower space portion 92 has a hemispherical shape that is curved downward. A through-hole which communicates with the upper through-hole 61*a* is formed in the center of the abutment pad 80 disposed in the upper space portion 91. A through-hole which communicates with the lower through-hole 62*a* is formed in the center of the abutment pad 80 disposed in the lower space portion 92.

As described above, in the present embodiment, the transducer 1 includes abutment pads (abutment members) 80. When the vibration membrane 16 is displaced in the membrane thickness direction, the abutment pads limit the displacement of the vibration membrane 16 by abutting the piezoelectric element 10 or the vibration membrane 16.

According to this configuration, the displacement of the vibration membrane 16 can be limited by means of the abutment pads 80, and therefore excessive displacement of the vibration membrane 16 caused by an impact can be suppressed. This can suppress the occurrence of breakage. Accordingly, it is possible to provide the transducer 1 having resistance to impact.

In the present embodiment, the package 60 is formed of the four substrates 61 to 63, which are laminated along the membrane thickness direction of the vibration membrane 16.

According to this configuration, each of the substrates 61 to 63 is formed in a predetermined shape and the substrates 61 to 63 are laminated. Accordingly, the package 60 having a desired shape can be easily formed.

The transducer 1 according to the present embodiment is not limited to one having the configuration described above and can be changed in various ways. Hereinafter, modified examples of the transducer 1 according to the present embodiment will be described with reference to FIGS. 5A to 10. Although FIGS. 5A to 10 do not show the abutment pads 80, the abutment pads 80 can be applied also in these modified examples.

First Modified Example

Figure 5A:
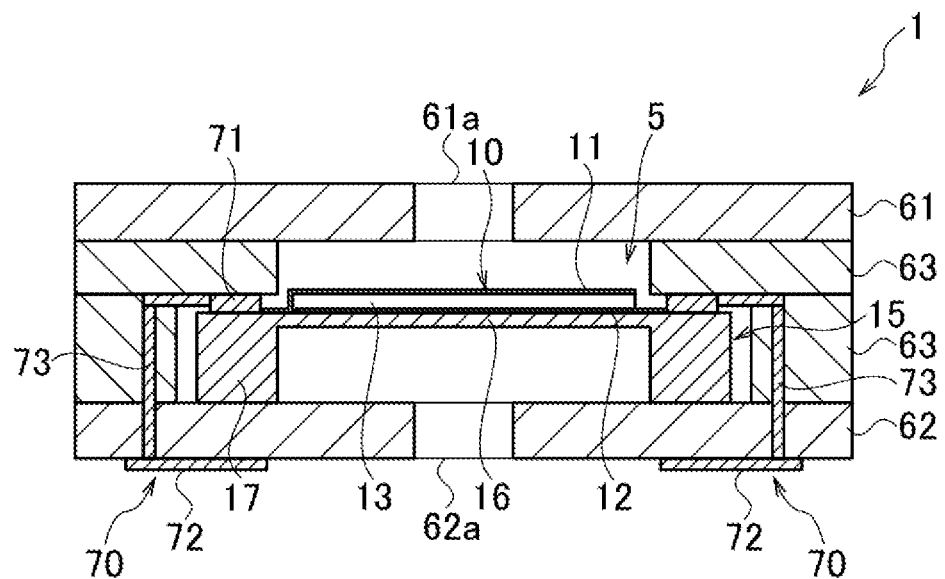
FIG. 5A is a cross-sectional view for explaining a configuration of a module electrode.
Figure 5B:
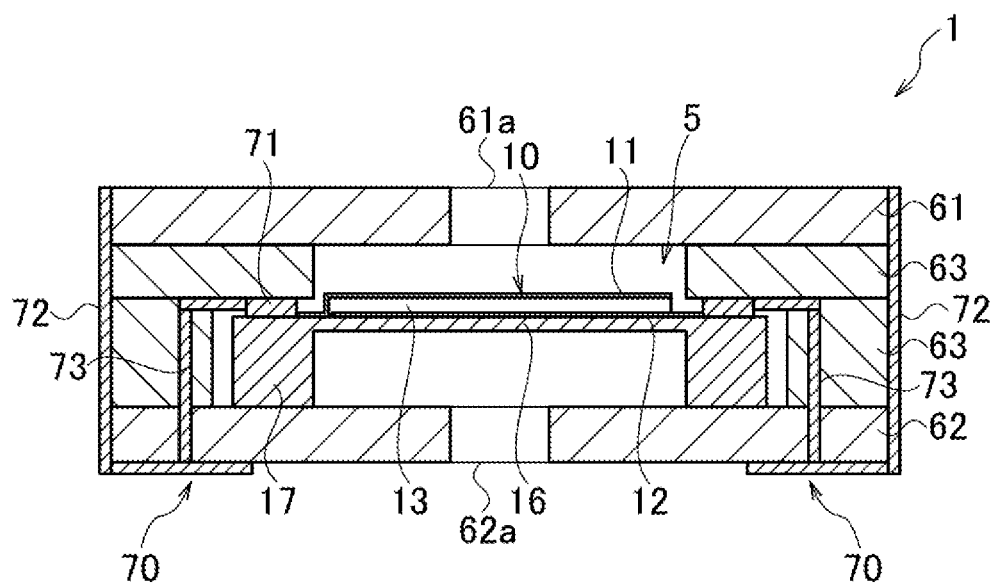
FIG. 5B is a cross-sectional view for explaining a configuration of a module electrode.

First, in the above described embodiment, the module electrodes 72 are provided on the upper surface of the package 60. However, it is sufficient if the module electrodes 72 are provided on the outer surface of the package 60. As shown in FIG. 5A, the module electrodes 72 are formed on the lower surface side of the lower substrate 62. Accordingly, the module electrodes 72 can be provided on the lower surface of the package 60. Further, as shown in FIG. 5B, each side surface of the package 60 is formed by vertically arranging end surfaces of the four substrates 61 to 63. Therefore, by forming the module electrodes 72 on the end surfaces of the four substrates 61 to 63, the module electrodes 72 can be disposed on the side surfaces of the package 60.

The package 60 is formed by laminating the four substrates 61 to 63 in this way. Therefore, the degree of freedom regarding the layout of the module electrodes 72 can be enhanced.

Second Modified Example

In the above described embodiment, a driving voltage applied to the pair of electrodes 11 and 12 is changed. This change is performed by an electronic component which is electrically connected to a module electrode. In this case, the electronic component may be disposed in the package 60.

Figure 6A:
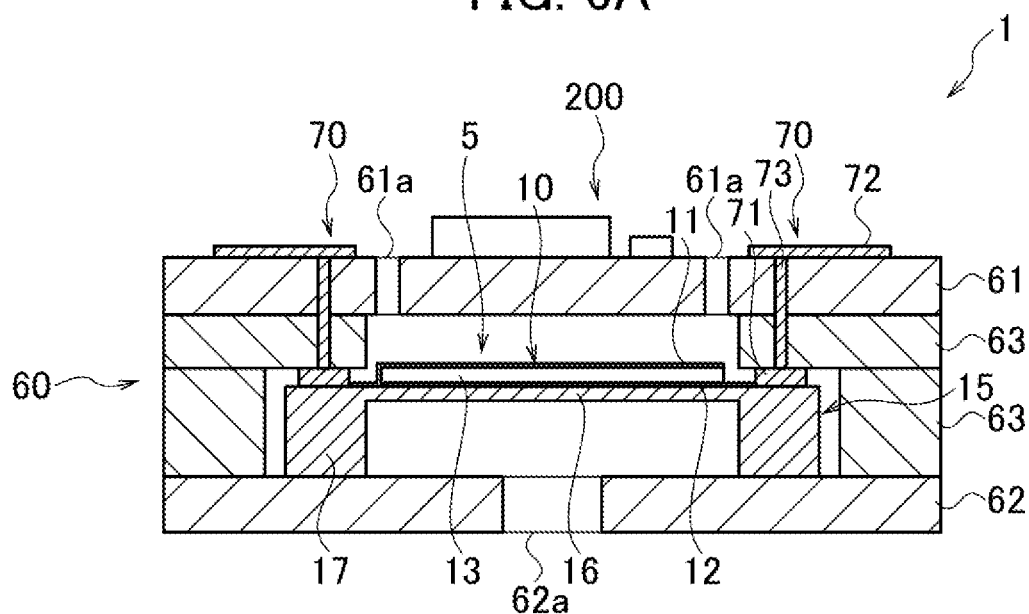
FIG. 6A is a cross-sectional view for explaining a mounting configuration of an electronic component.
Figure 6B:
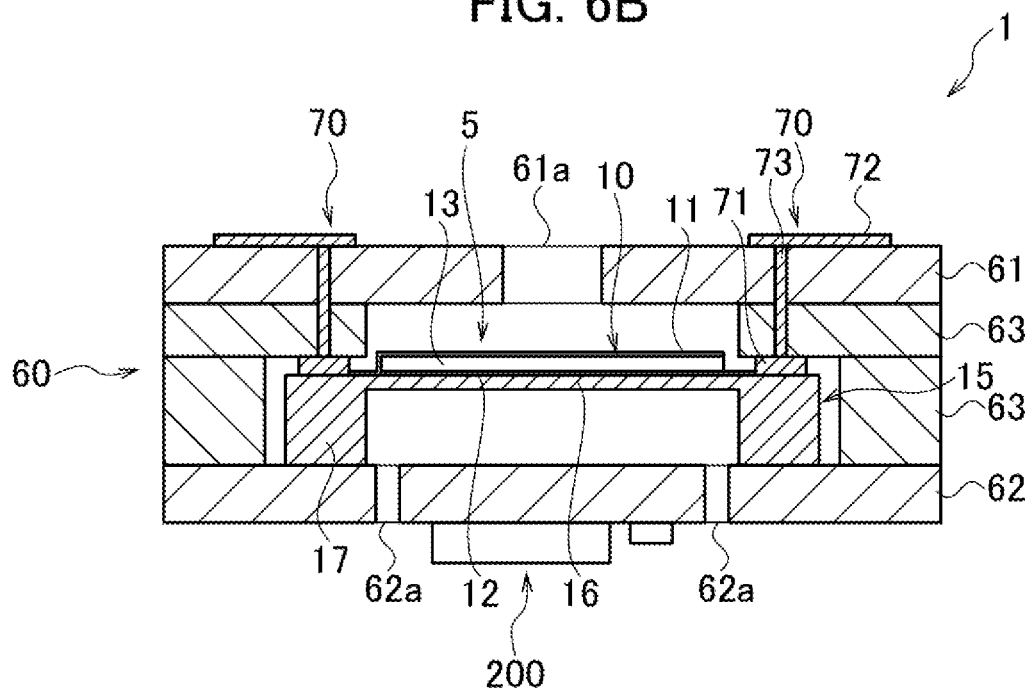
FIG. 6B is a cross-sectional view for explaining a mounting configuration of an electronic component.
Figure 6C:
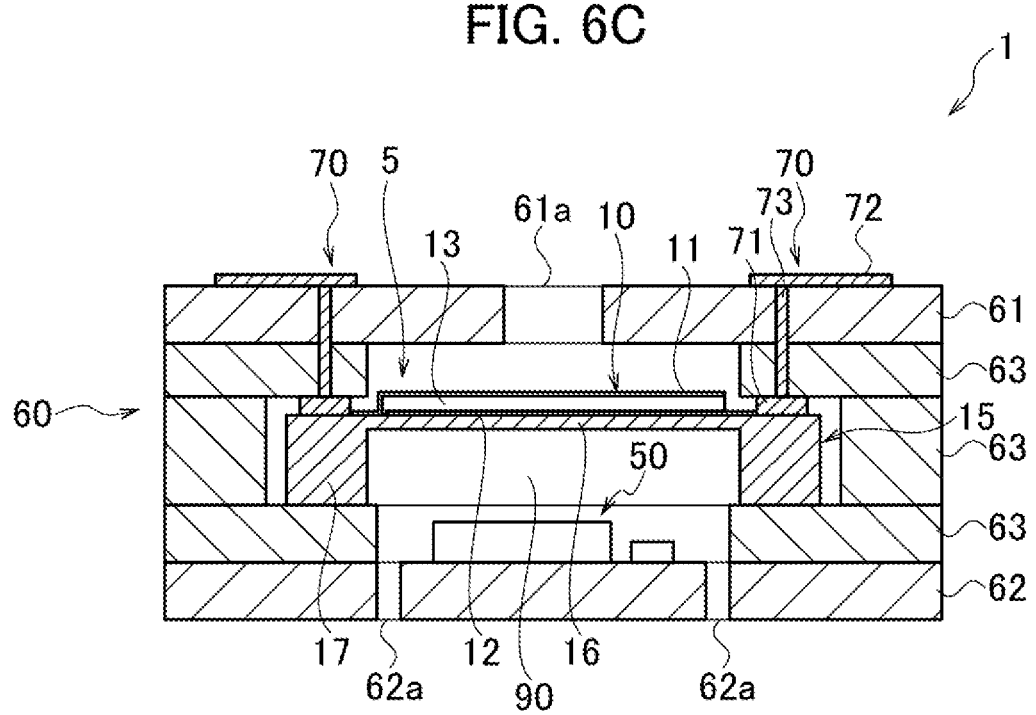
FIG. 6C is a cross-sectional view for explaining a mounting configuration of an electronic component.

In FIG. 6A, an electronic component 200 is mounted on the upper surface of the upper substrate 61 and disposed on the upper surface of the package 60. In FIG. 6B, an electronic component 200 is mounted on the lower surface of the lower substrate 62 and disposed on the lower surface of the package 60. In the example shown in FIG. 6C, an electronic component 200 is mounted on the upper surface of the lower substrate 62 and is disposed in the internal space 90.

Suppose that the electronic component 200 is provided in the package 60. In the above case, power supply wiring (not shown) and signal wiring (not shown) can be formed in the package 60. The power supply wiring supplies power to the electronic component 200 and the signal wiring supplies a signal to the electronic component 200. Suppose that the electronic component 200 is mounted on the upper surface or the lower surface of the package 60. In the above cases, it is preferable to form an upper through-hole 61*a* or a lower through-hole 62*a* in consideration of the mounting space of the electronic component 200.

The package 60 is formed by laminating the four substrates 61 to 63, and therefore the electronic component 200 can be mounted on the package 60. This enables the provision of the transducer 1 having the sound chip 5 and the electronic component 200 as a set.

Third Modified Example

In the above described embodiment, the four substrates 61 to 63 are set to have the same shape and size. However, the four substrates 61 to 63 may be different in shape or size from each other.

Figure 7A:
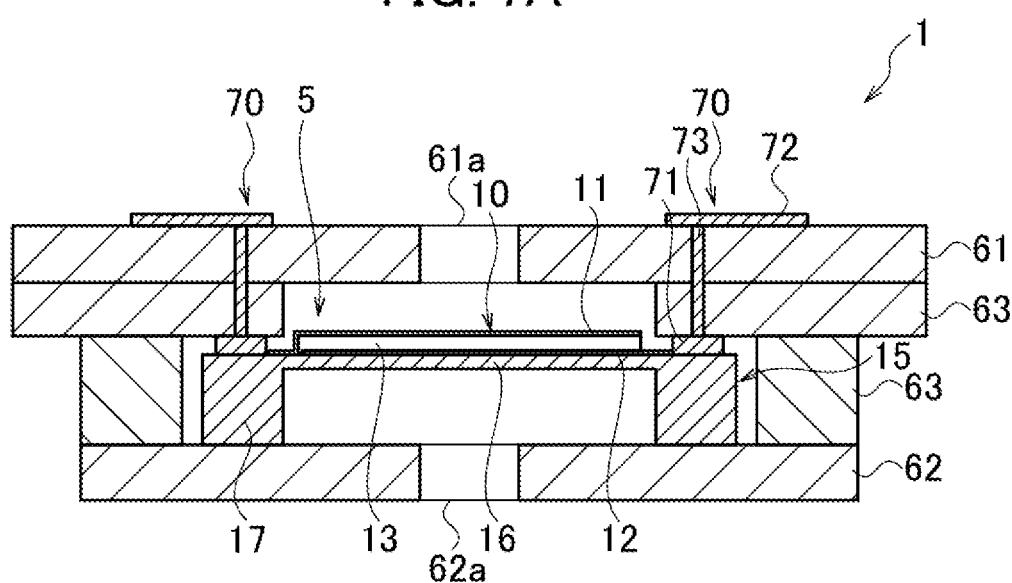
FIG. 7A is a cross-sectional view for explaining a configuration of a package.

In FIG. 7A, among the four substrates 61 to 63, substrates on the upper side are the substrates 61 and 63 (upper substrate 61 and intermediate substrate 63 which is positioned below and adjacent to the upper substrate 61). The substrates on the lower side are the substrates 62 and 63 (lower substrate 62 and intermediate substrate 63 which is positioned above and adjacent to the lower substrate 62). The substrates 61 and 63 on the upper side are set to have a size (area) larger than that of the substrates 62 and 63 on the lower side. Due to such a difference in size, peripheral edges of the substrates 61 and 63 on the upper side project further outward than peripheral edges of the substrates 62 and 63 on the lower side. That is, projecting regions of the substrates 61 and 63 on the upper side are formed in a flange shape so as to extend around the entire side surfaces of the package 60.

According to this configuration, when the package 60 is assembled to a product housing for housing the package 60, the package 60 can be fixed to the product housing by using the projecting regions of the substrates 61 and 63 on the upper side. Accordingly, the package 60 can be efficiently fixed to the product housing. In this case, the product housing preferably has a structure for receiving the projecting regions of the substrates 61 and 63 on the upper side.

In addition, according to this configuration, the projecting regions of the substrates 61 and 63 on the upper side are provided around the whole periphery of the package 60. Therefore, a clearance occurring between the product housing and the package 60 can be closed. This can control the airflow around the package 60. Therefore, the output characteristics of sound waves can be stabilized.

Figure 7B:
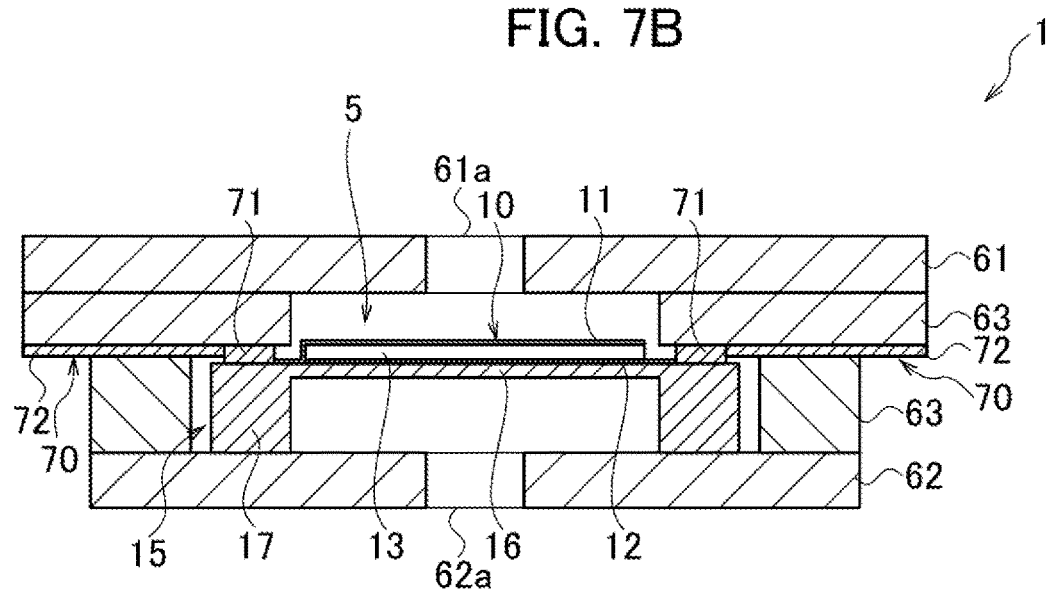
FIG. 7B is a cross-sectional view for explaining a configuration of a package.

The intermediate substrate 63 which is positioned below and adjacent to the upper substrate 61 projects outward, and therefore the lower surface of the intermediate substrate 63 is also exposed to the outside of the package 60. Therefore, as shown in FIG. 7B, module electrodes 72 may be formed on the lower surface of the intermediate substrate 63. This can directly connect the chip electrodes 71 and the module electrodes 72. Accordingly, external electrodes 70 can be easily formed.

Figure 7C:
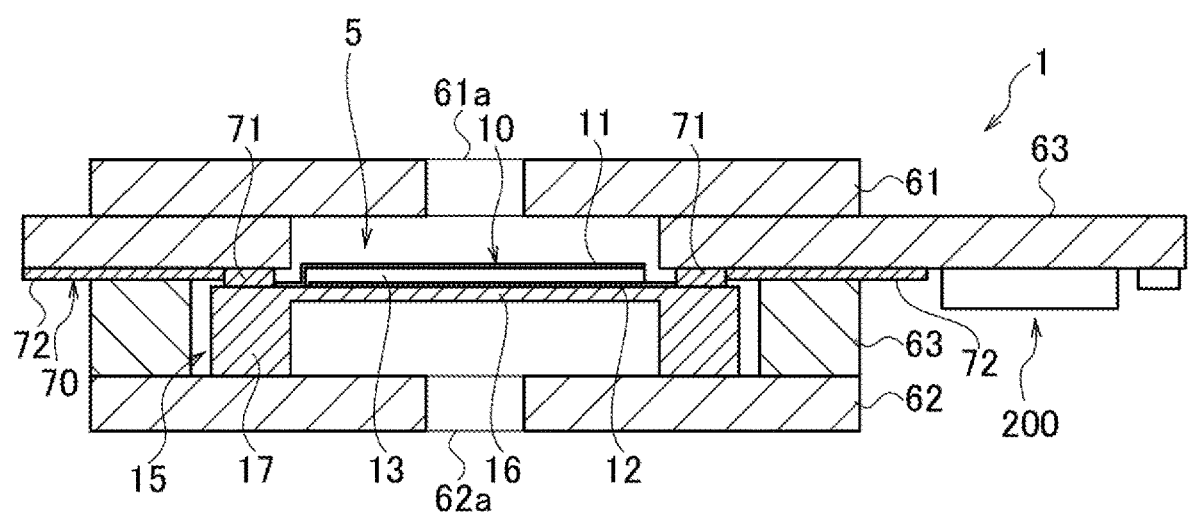
FIG. 7C is a cross-sectional view for explaining a configuration of a package.

Further, as shown in FIG. 7C, the electronic component 200 may be mounted on the lower surface of the intermediate substrate 63. Further, as shown in FIG. 7C, the number of substrates of which the size is increased may be one or more of the four substrates 61 to 63.

Fourth Modified Example

Figure 8A:
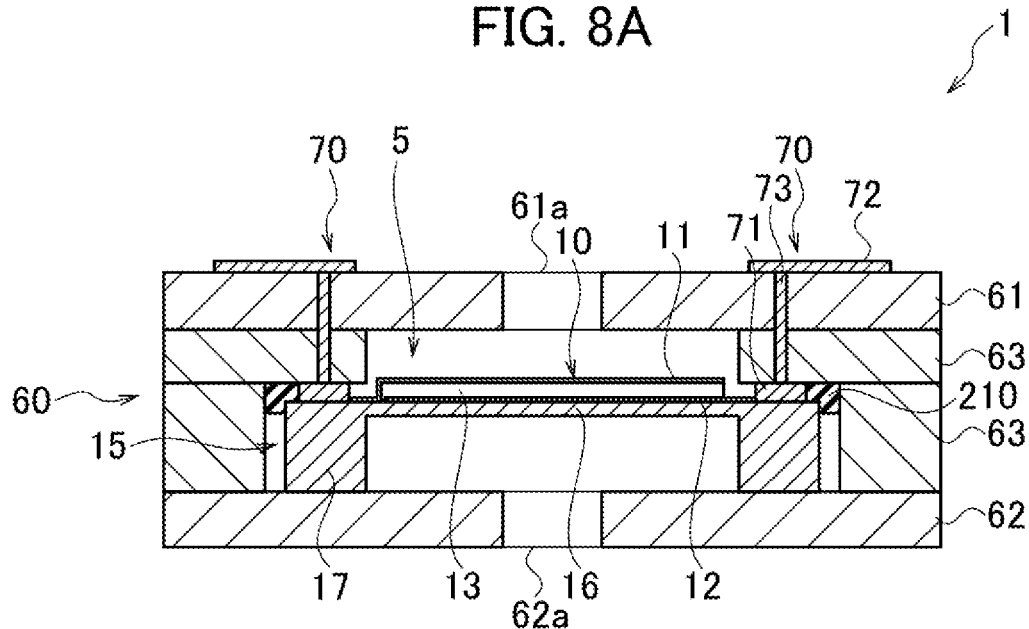
FIG. 8A is a cross-sectional view for explaining a seal structure between a package and a sound chip.

In FIG. 8A, the transducer 1 further includes a sealing member 210. The sealing member 210 is arranged in a clearance formed between the package 60 and the membrane body 15. The sealing member 210 is formed in a ring shape and functions to seal the clearance between the package 60 and the membrane body 15.

With this configuration, the clearance formed between the package 60 and the membrane body 15 can be sealed. This can regulate the air flowing through the clearance formed between the package 60 and the membrane body 15 and form an intended airflow. As a result, the output characteristics of sound waves can be stabilized.

Fifth Modified Example

Figure 8B:
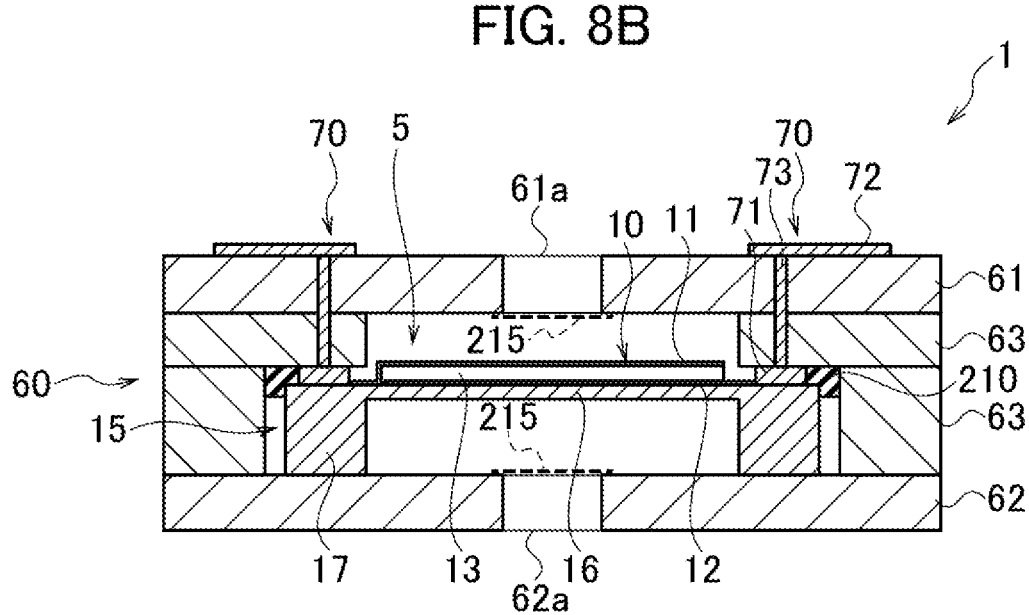
FIG. 8B is a cross-sectional view for explaining a sheet member for closing a first through-hole and a second through-hole.

In FIG. 8B, the transducer 1 further includes sheet members 215. A sheet member 215 is provided on the lower surface side of the upper substrate 61 so as to close the upper through-hole 61a. A sheet member 215 is provided on the upper surface side of the lower substrate 62 so as to close the lower through-hole 62a. The sheet members 215 are formed in a sheet shape and are formed of materials capable of allowing air to pass therethrough. As the sheet members 215, a nonwoven fabric or a waterproof breathable fabric such as Gore-Tex® can be used.

According to this configuration, the upper through-hole 61a and the lower through-hole 62a are closed with the sheet members 215. Therefore, it is possible to prevent dust or liquid from entering the internal space 90. Meanwhile, the sheet members 215 are formed of a material allowing air to pass therethrough. Therefore, it is possible to maintain the flow of air through the upper through-hole 61a and the lower through-hole 62a. In the example shown in FIG. 8B, the transducer 1 includes the sealing member 210. However, the sheet members 215 may be applied to a configuration without the sealing member 210.

Sixth Modified Example

In the embodiment shown in FIGS. 1 and 2, the upper through-hole 61a is set to have a linear shape along the thickness direction of the upper substrate 61. However, the upper through-hole 61a may have a shape other than a linear shape.

Figure 8C:
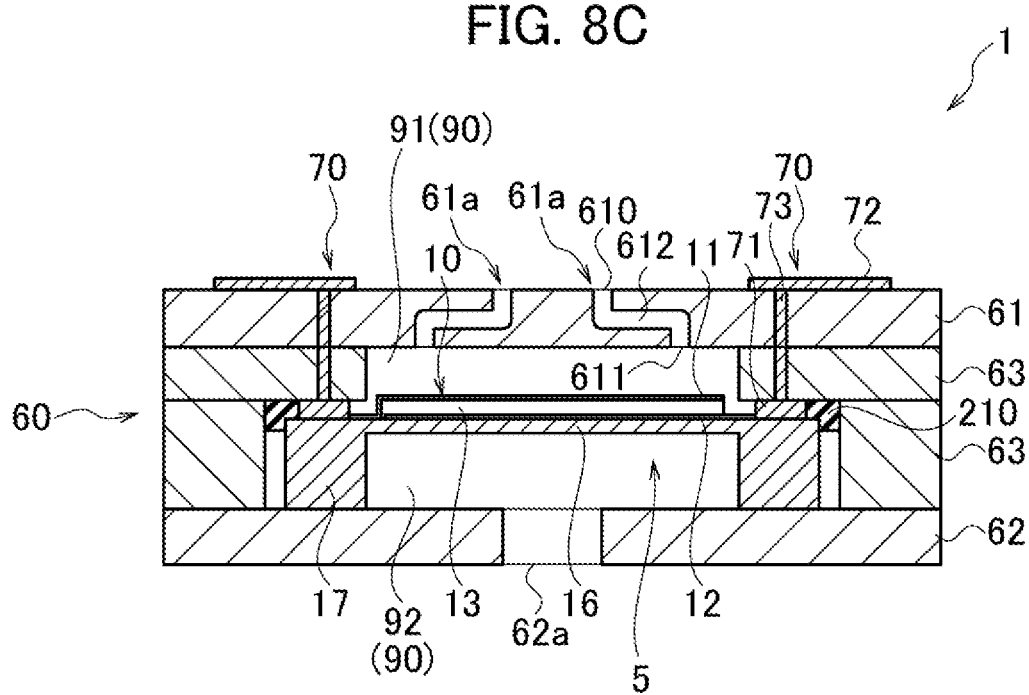
FIG. 8C is a cross-sectional view for explaining a configuration of a first through-hole.

In FIG. 8C, the upper through-hole 61a includes a first opening 610, a second opening 611, and a communication portion 612. The first opening 610 is positioned on the external space side of the package 60. The second opening 611 is positioned on the internal space 90 (upper space portion 91) side. The communication portion 612 communicates the first opening 610 with the second opening 611. When viewed in a plane parallel to the vibration membrane 16, the position of the first opening 610 is different from the position of the second opening 611. That is, it is not possible to extend linearly from the first opening 610 to the second opening 611. Therefore, the communication portion 612 has a shape that bends and curves. Accordingly, the upper through-hole 61a is formed in a non-linear shape as a whole.

According to such a configuration, the upper through-hole 61a is not formed in a linear shape. This can prevent dust and the like from entering the internal space 90. Meanwhile, the upper through-hole 61a allows communication, and therefore the flow of air can be maintained. The transducer 1 includes the sealing member 210 in the example shown in FIG. 8C. However, the configuration shown in FIG. 8C may be applied to a configuration without the sealing member 210 also. The configuration shown in FIG. 8C can be applied to not only the upper through-hole 61a but also the lower through-hole 62a.

Seventh Modified Example

Figure 9A:
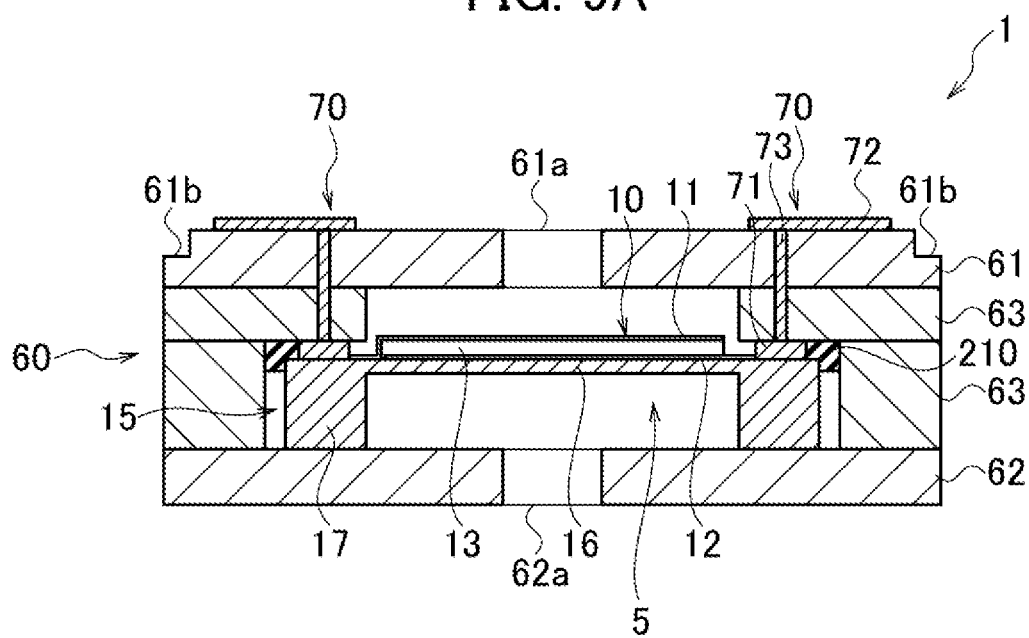
FIG. 9A is a cross-sectional view for explaining a groove portion formed on a package.

In FIG. 9A, groove portions 61b which are recessed inward are formed on the upper surface of the package 60, that is, at peripheral edges of the upper surface of the upper substrate 61. The groove portions 61b are formed at all peripheral edges of the upper substrate 61 so as to extend around the entire periphery of the package 60.

According to this configuration, suppose that the package 60 is assembled to a product housing for housing the package 60. In the above case, the package 60 and the product housing can be fixed by fitting the product housing to the groove portions 61b. This can efficiently fix the package 60 to the product housing. In this case, it is preferable that the product housing has projection structures to be fitted to the groove portions 61b of the package 60.

According to this configuration, a clearance occurring between the product housing and the package 60 can be closed by fitting the groove portions 61b and the product housing. As a result, the airflow around the package 60 can be controlled, and therefore the output characteristics of sound waves can be stabilized.

Figure 9B:
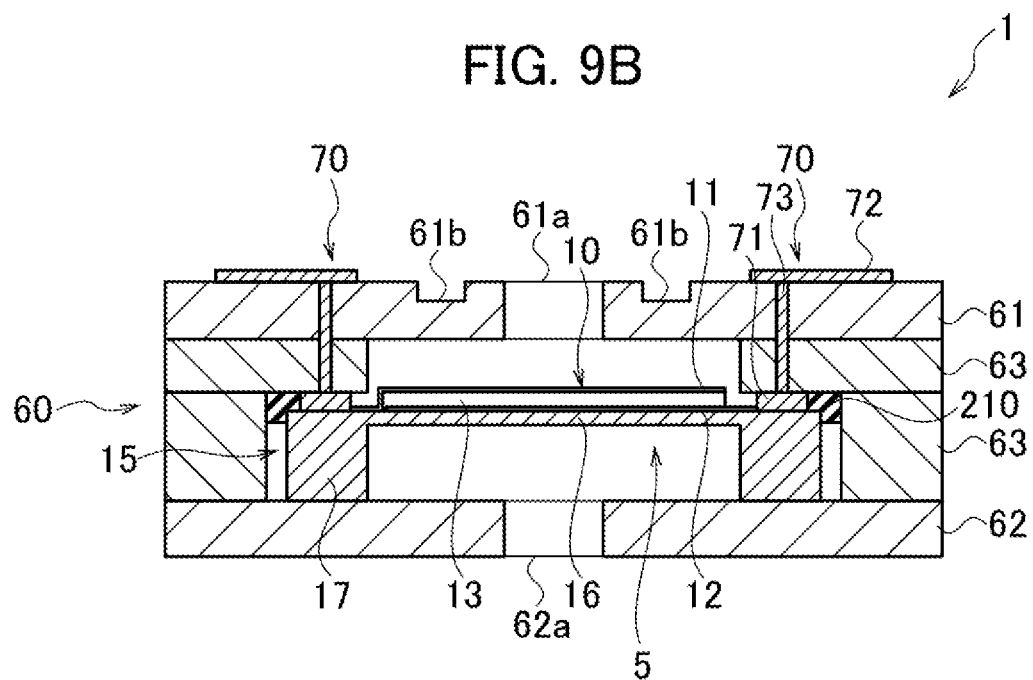
FIG. 9B is a cross-sectional view for explaining a groove portion formed on a package.
Figure 9C:
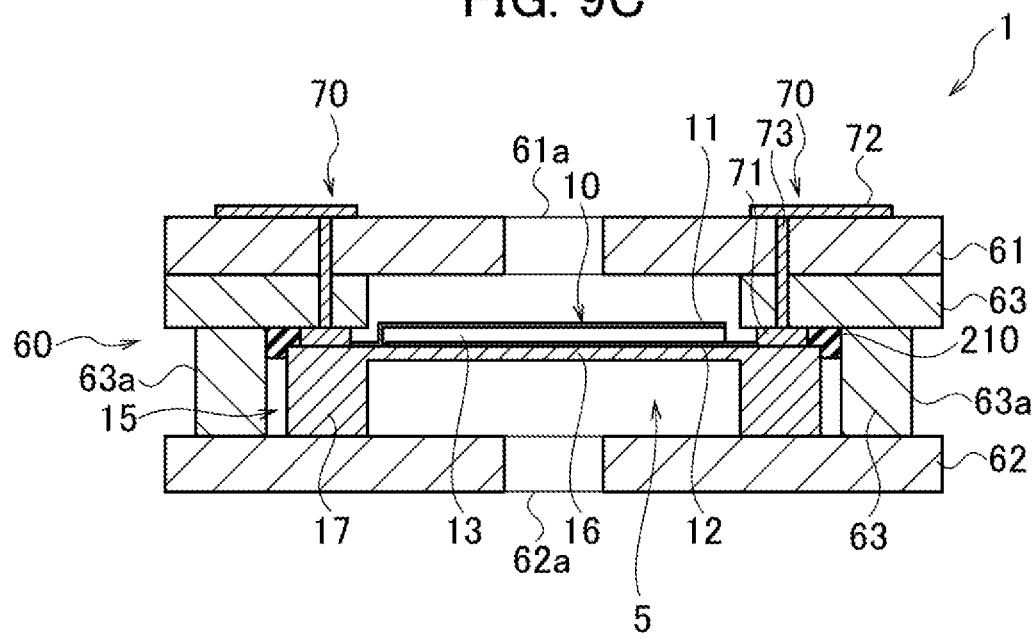
FIG. 9C is a cross-sectional view for explaining a groove portion formed on a package.

In the example shown in FIG. 9A, the groove portions 61b are provided at the peripheral edges of the upper surface of the package 60. However, the groove portions 61b may be provided at peripheral edges of the lower surface of the package 60. Further, as shown in FIG. 9B, groove portions 61b may be provided around the upper through-hole 61a in the upper surface of the package 60. It is needless to say that groove portions 61b may be provided around the lower through-hole 62a in the lower surface of the package 60. Further, as shown in FIG. 9C, groove portions 63a may be formed on side surfaces of the package 60.

Figure 10:
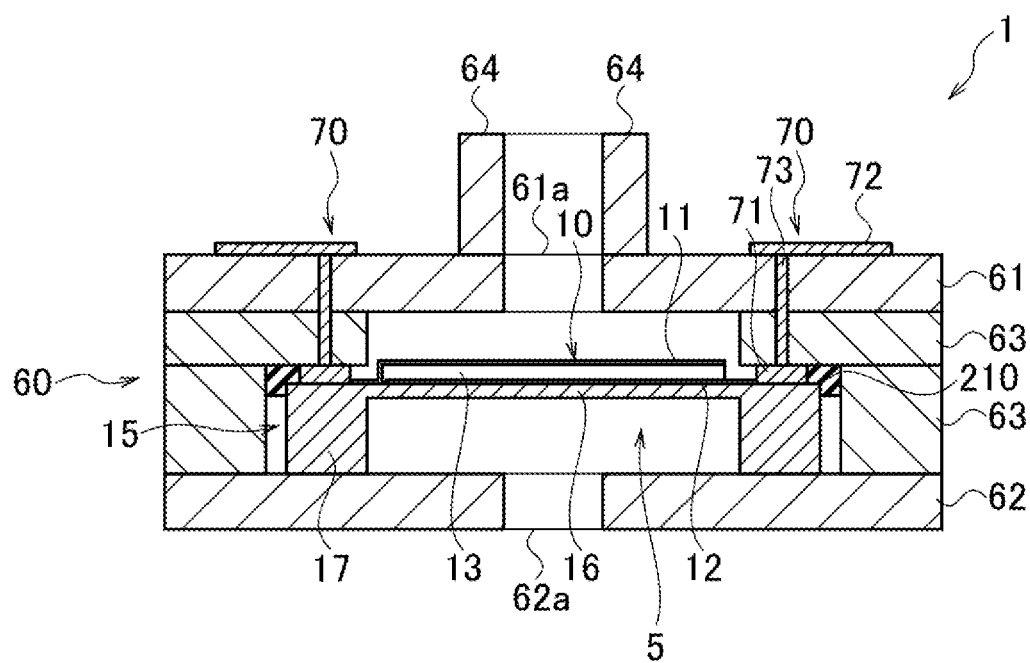
FIG. 10 is a cross-sectional view for explaining a projection formed on a package.

Instead of the groove portions 61b, as shown in FIG. 10, the package 60 may have projections 64 that stand on the upper surface of the package 60. By using the projections 64, the package 60 can be assembled to the product housing. In this case, the projections 64 may be provided not only on the upper surface of the package 60 but also on the lower surface of the package 60.

Figure 11A:
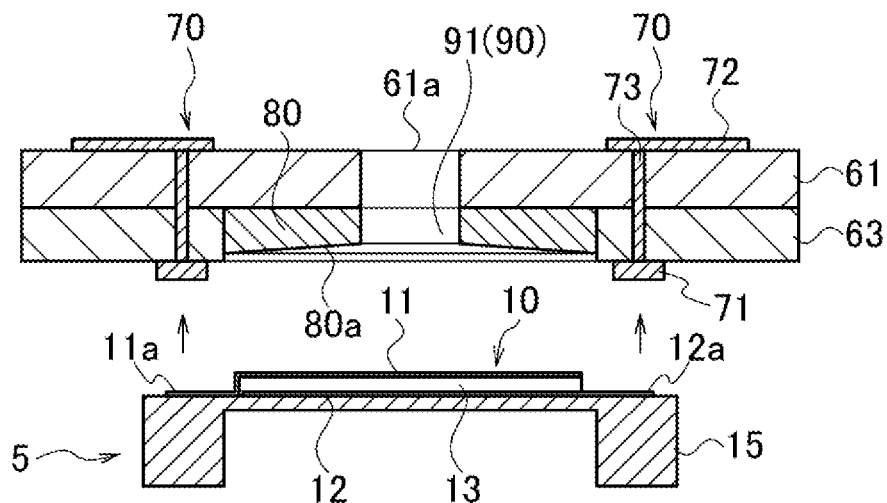
FIG. 11A is a cross-sectional view showing a manufacturing process of a transducer.
Figure 11B:
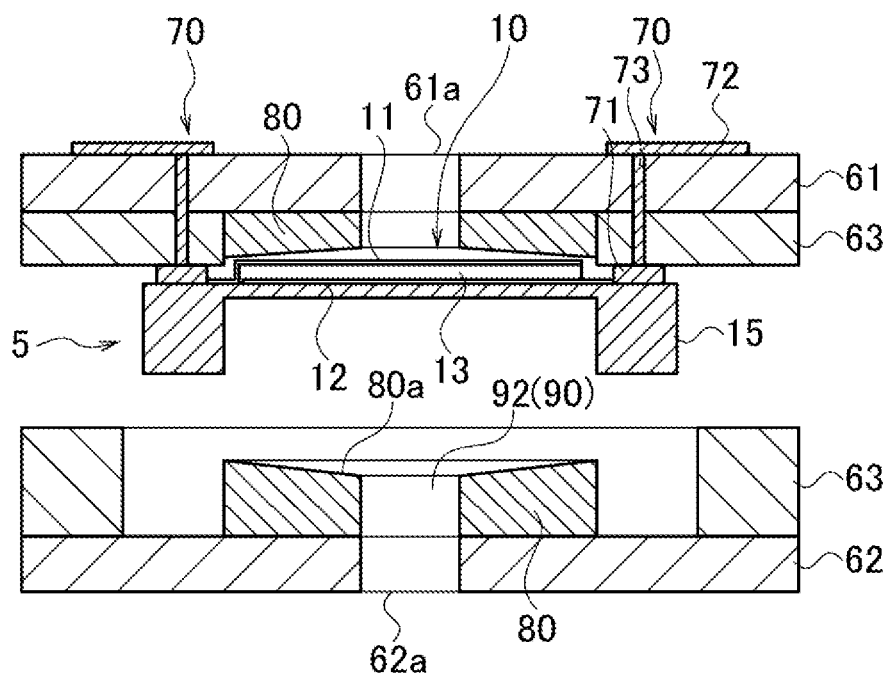
FIG. 11B is a cross-sectional view showing a manufacturing process of a transducer.
Figure 12:
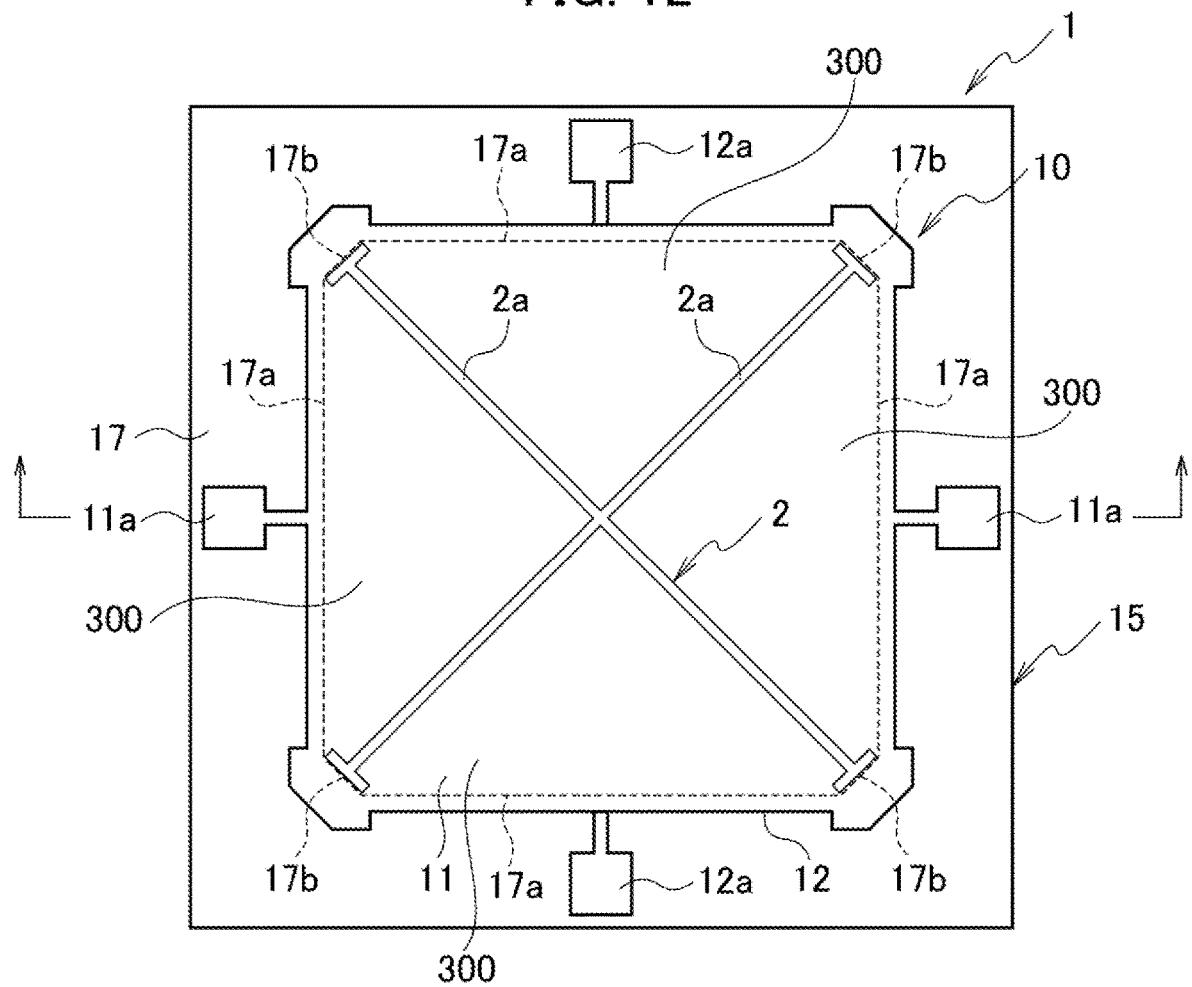
FIG. 12 is a top view of a transducer according to a second embodiment.
Figure 13:
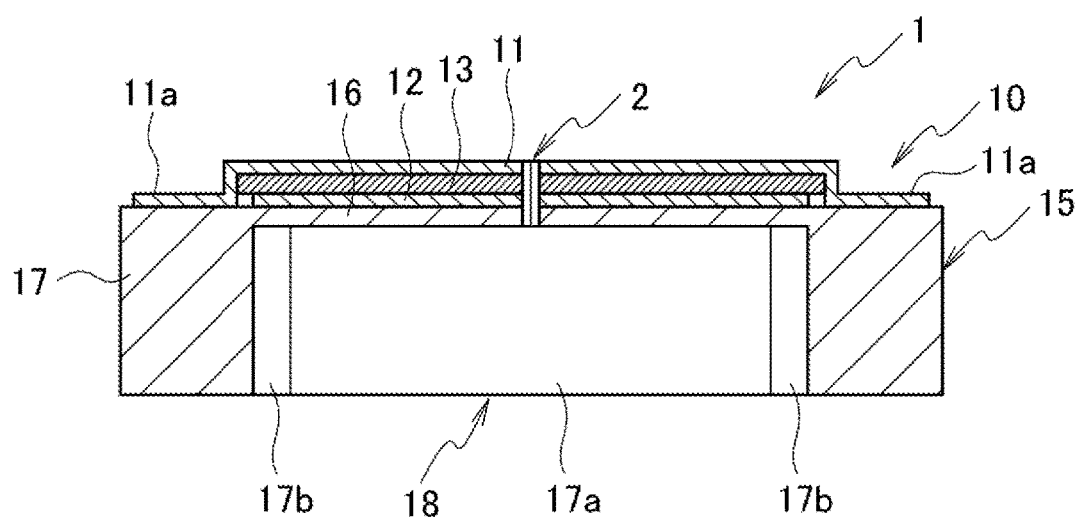
FIG. 13 is a cross-sectional view taken along the direction of an arrow in FIG. 12.

With reference to FIGS. 11A and 11B, a method of manufacturing the transducer 1 according to the present embodiment, specifically, a method of packaging the sound chip 5 by means of the package 60 will be described below. The transducer 1 has the configuration shown in FIGS. 1 and 2.

First, upper-side substrates 61 and 63 including an upper substrate 61 and an intermediate substrate 63 which is laminated below the upper substrate 61 are prepared. An abutment pad 80 is disposed in an upper space portion 91 formed by means of the upper-side substrates 61 and 63. External electrodes 70 are formed on the upper-side substrates 61 and 63.

Then, the sound chip 5 is mounted on the substrates 61 and 63 on the upper side. The sound chip 5 is arranged such that electrode pads 11a and 12a face upward, and the sound chip 5 is mounted on the substrates 61 and 63 on the upper side.

Next, lower-side substrates 62 and 63 including a lower substrate 62 and an intermediate substrate 63 which is laminated on the lower substrate 62 are prepared. An abutment pad 80 is provided in a lower space portion 92 formed by means of the lower-side substrates 62 and 63.

The substrates 62 and 63 on the lower side are bonded to the substrates 61 and 63 on the upper side with the sound chip 5 therebetween. Accordingly, the sound chip 5 is packaged by means of the package 60 and the formation of the transducer 1 is completed.

The substrates 61 to 63 are large-sized substrates. A plurality of units are mounted on the substrates 61 to 63, each unit including the sound chip 5, the external electrodes 70, and the abutment pads. Finally, the substrates 61 to 63 are cut and individual sound chips 5 are separated. Accordingly, the formation of the transducer 1 shown in FIGS. 1 and 2 is completed Suppose that an impact is applied to the transducer 1 at the time of performing the separation. Even in the above case, the displacement of the vibration membrane 16 can be limited by means of the abutment pads 80. As a result, the vibration membrane 16 can be prevented from being excessively displaced by an impact. This can suppress the occurrence of breakage. Accordingly, the transducer 1 having resistance to impact can be provided.

Second Embodiment

The configuration of a transducer 1 according to the present embodiment will be described with reference to FIGS. 12 to 14B. The transducer 1 according to the present embodiment is mainly formed of a piezoelectric element 10 and a membrane body 15. In the following description, the up and down direction is defined based on the state of the transducer 1 shown in FIG. 13, but the direction in which the transducer 1 is used is not limited.

The piezoelectric element 10 includes a pair of electrodes 11 and 12 and a piezoelectric membrane 13 which is interposed between the pair of electrodes 11 and 12. The pair of electrodes 11 and 12 and the piezoelectric membrane 13 have a shape corresponding to the shape of a vibration membrane 16 which will be described later, and have a square shape in the examples shown in FIGS. 12 to 13B.

Each of the pair of electrodes 11 and 12 is formed of a thin membrane of a conductive metal such as aluminum or copper, for example. One of the pair of electrodes, namely the electrode 11, is positioned above the piezoelectric membrane 13. The electrode 11 is connected to electrode pads 11a which are a circuit pattern for applying a driving voltage to the electrode 11. The other of the pair of electrodes, namely the electrode 12, is positioned below the piezoelectric membrane 13. The electrode 12 is connected to electrode pads 12a which are a circuit pattern for applying a driving voltage to the electrode 12.

The piezoelectric membrane 13 is composed of, for example, a lead zirconate titanate (PZT) membrane. For the piezoelectric membrane 13, aluminum nitride (AlZ), zinc oxide (ZnO), lead titanate (PbTiO3), or the like can be used in addition to lead zirconate titanate.

The membrane body 15 is composed of a vibration membrane 16 and a membrane support portion 17. The membrane body 15 is made of, for example, silicon (Si). The vibration membrane 16 and the membrane support portion 17 are integrally formed by etching the lower surface side of the membrane body 15.

The vibration membrane 16 is formed of a thin membrane. The vibration membrane 16 is displaceable in the membrane thickness direction, that is, in the direction normal to the vibration membrane 16 (the direction perpendicular to the plane of FIG. 12 and the up and down direction in the page space of FIG. 13). The vibration membrane 16 has a substantially square shape when viewed in a plane parallel to the vibration membrane 16.

The membrane support portion 17 has a square cylindrical inner peripheral surface which forms a cavity (hollow portion) 18. The whole periphery of the vibration membrane 16 is connected to the inner peripheral surface of the membrane support portion 17 so that the vibration membrane 16 makes contact with the inside of the membrane support portion 17. Accordingly, the periphery of the vibration membrane 16 is supported by the membrane support portion 17. The vibration membrane 16 is connected to the upper end side of the membrane support portion 17, and the upper side of the cavity 18 is closed by the vibration membrane 16.

The inner peripheral surface is composed of four flat portions 17a and four corner portions 17b. Each corner portion 17b connects any two adjacent flat portions 17a of the four flat portions 17a. Each corner portion 17b has a chamfered shape instead of having a shape corresponding to an inner angle of a square. The chamfered shape of the corner portions 17b is formed in a linear shape when viewed in a plane parallel to the vibration membrane 16. End portions of the flat portions 17a are connected to end portions of the chamfered corner portions 17b. The adjacent flat portions 17a are connected through the chamfered corner portions 17b. Accordingly, the flat portions 17a and the corner portions 17b are connected at an angle (obtuse angle) which is larger than an angle (inner angle of square) formed between the adjacent flat portions 17a. Further, when viewed in a plane parallel to the vibration membrane 16, the corner portions 17b may be formed by combining a plurality of straight lines or formed of a curve line in addition to being formed of a single straight line.

The transducer 1 includes a dividing slit 2. The dividing slit 2 penetrates a vibrator which is formed by laminating the piezoelectric element 10 and the vibration membrane 16 in the thickness direction. The vibrator is divided into a plurality of vibration regions 300 by the dividing slit 2.

The dividing slit 2 has main slit portions 2a which extend from the center of the vibration membrane 16 toward the corner portions 17b. In the present embodiment, the inner peripheral surface has a square shape. Therefore, the dividing slit 2 has four main slit portions 2a. The vibrator formed by laminating the piezoelectric element 10 and the vibration membrane 16 is divided into four vibration regions 300 by means of the four main slit portions 2a.

Each of the divided regions of the vibration membrane 16 has a cantilever shape which projects from the membrane support portion 17 toward the center of the vibration membrane 16. The distal end of each vibration membrane 16 is formed as a free end.

Figure 14A:
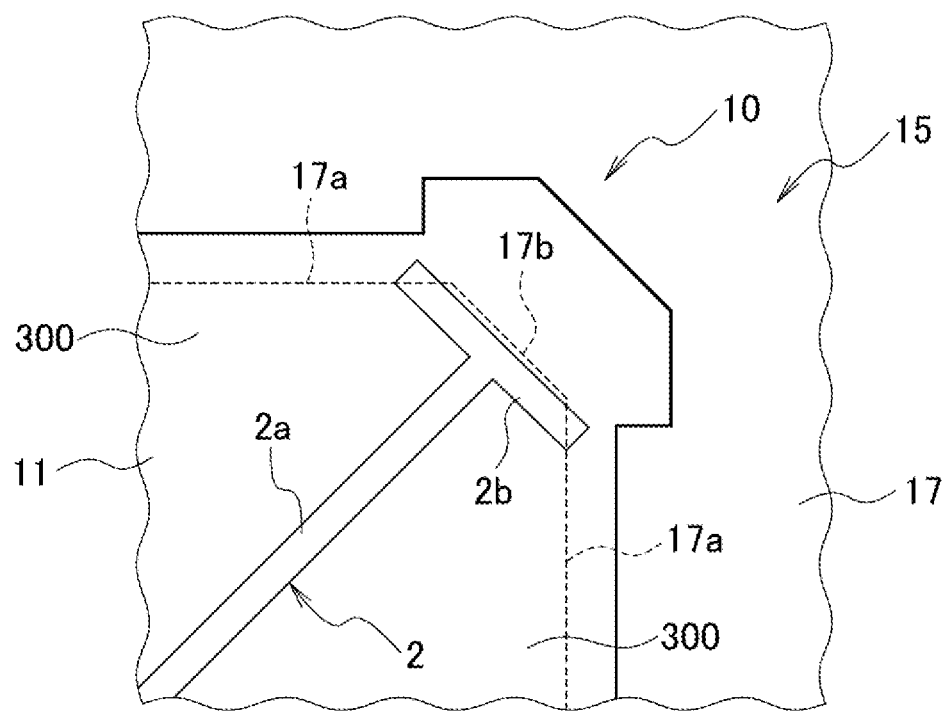
FIG. 14A is an enlarged top view of a structure of a dividing slit positioned at a corner portion of an inner peripheral surface.

As shown in FIG. 14A, the dividing slit 2 includes sub-slit portions 2b. The sub-slit portions 2b extend from connecting portions at which the corner portions 17b and the flat portions 17a are connected, that is, corners between the corner portions 17b and the flat portions 17a to end portions of the main slit portions 2a on the side of the corner portions 17b. Corners are present on both sides of each corner portion 17b, and therefore two sub-slit portions 2b are provided for one main slit portion 2a.

Figure 14B:
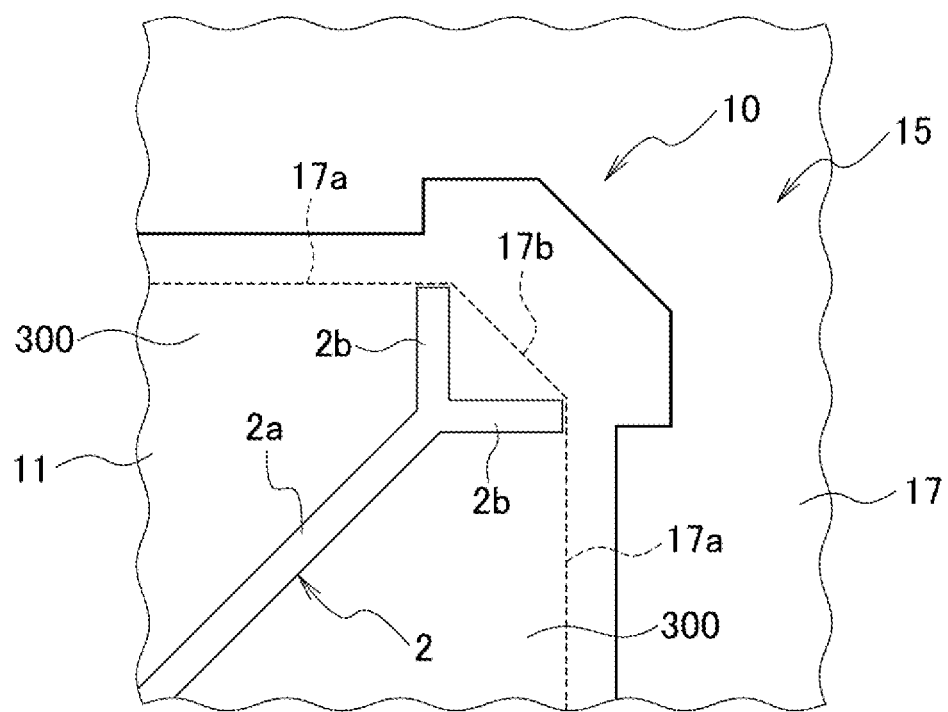
FIG. 14B is a diagram for explaining a modified example of the structure shown in FIG. 14A.

Suppose that, for example, end portions of the main slit portions 2a reach the corner portion 17b. In the above case, as shown in FIG. 14A, a sub-slit portion 2b is formed in a straight line and is connected to each main slit portion 2a so as to form a T-shape. However, the main slit portions 2a need not reach the corner portions 17b. In this case, as shown in FIG. 14B, the sub-slit portions 2b are connected to each main slit portion 2a so as to form a Y-shape. Note that the sub-slit portions 2b may be formed in a shape other than a straight line. Suppose that the corner portions 17b are formed by combining a plurality of straight lines or are formed of a curve line when viewed in a plane parallel to the vibration membrane 16, for example. In the above case, the sub-slit portions 2b may be formed in a shape that follows the corner portions 17b.

In order to prevent the electrodes 11 and 12 from being divided by the dividing slit 2, a wiring portion is provided at a position corresponding to each corner portion 17b, the wiring portion being for interconnecting the electrodes 11 and 12 positioned in adjacent vibration regions 300.

In the transducer 1 having such a configuration, the piezoelectric element 10 is disposed on the vibration membrane 16 of the membrane body 15. That is, the lower electrode 12, the piezoelectric membrane 13, and the upper electrode 11 are laminated in this order on the vibration membrane 16. When a driving voltage is applied to each of the pair of electrodes 11 and 12, a potential difference occurs between the pair of electrodes 11 and 12. The vibration membrane 16 is displaced by the potential difference. Specifically, the divided regions of the vibration membrane 16 are displaced such that the distal end sides of the divided regions of the vibration membrane 16 are warped.

Suppose that a driving voltage is repeatedly applied to the pair of electrodes 11 and 12. In the above case, the vibration membrane 16 alternately repeats displacement to the upper side and displacement to the lower side. Due to the vibration of the vibration membrane 16, the air around the vibration membrane 16 is vibrated. Accordingly, the vibration of the air is output as sound waves.

As described above, in the present embodiment, the inner peripheral surface forming the cavity 18 has a square shape in which the four flat portions 17a are connected through the chamfered corner portions 17b. The dividing slit 2 has the main slit portions 2a and the sub-slit portions 2b. The main slit portions 2a extend from the center of the vibration membrane 16 toward the corner portions 17b. The sub-slit portions 2b extend from connecting portions (corners) at which the corner portions 17b and the flat portions 17a are connected toward end portions of the main slit portions 2a on the corner portions 17b side.

According to this configuration, the corner portions 17b of the inner peripheral surface are chamfered. Therefore, an angle at which the flat portions 17a are connected to the corner portions 17b becomes large. This can alleviate stress concentrated in the corner portions 17b. As a result, the strength of the membrane support portion 17 can be enhanced.

If the corner portions 17b are chamfered, a connection portion between the divided regions of the vibration membrane 16 and the membrane support portion 17 includes a straight line along one flat portion 17a and a straight line along each corner portion 17b, and has a bent-shape. Bending points (corners) are present between the flat portions 17a and the corner portions 17b. Therefore, if the divided regions of the vibration membrane 16 are displaced, stress is concentrated at the bending points, and there is a risk that cracks or the like may occur.

Therefore, in the present embodiment, the sub-slit portions 2b extend from the end portions of the main slit portions 2a to the corners. Therefore, the connection portion between the divided regions of the vibration membrane 16 and the membrane support portion 17 is constituted only of linear regions corresponding to the flat portions 17a. Even if the vibration membrane 16 is displaced, the concentration of stress at a specific position can be suppressed. This can enhance the strength of the vibration membrane 16 and the membrane support portion 17. Accordingly, the occurrence of breakage can be suppressed.

In the above described embodiment, the inner peripheral surface forming the cavity 18 is formed into a square shape. However, it is sufficient if the inner peripheral surface is formed into a polygon. The inner peripheral surface may be formed into, for example, a hexagon or an octagon, or a pentagon or a heptagon.

Third Embodiment

Figure 15:
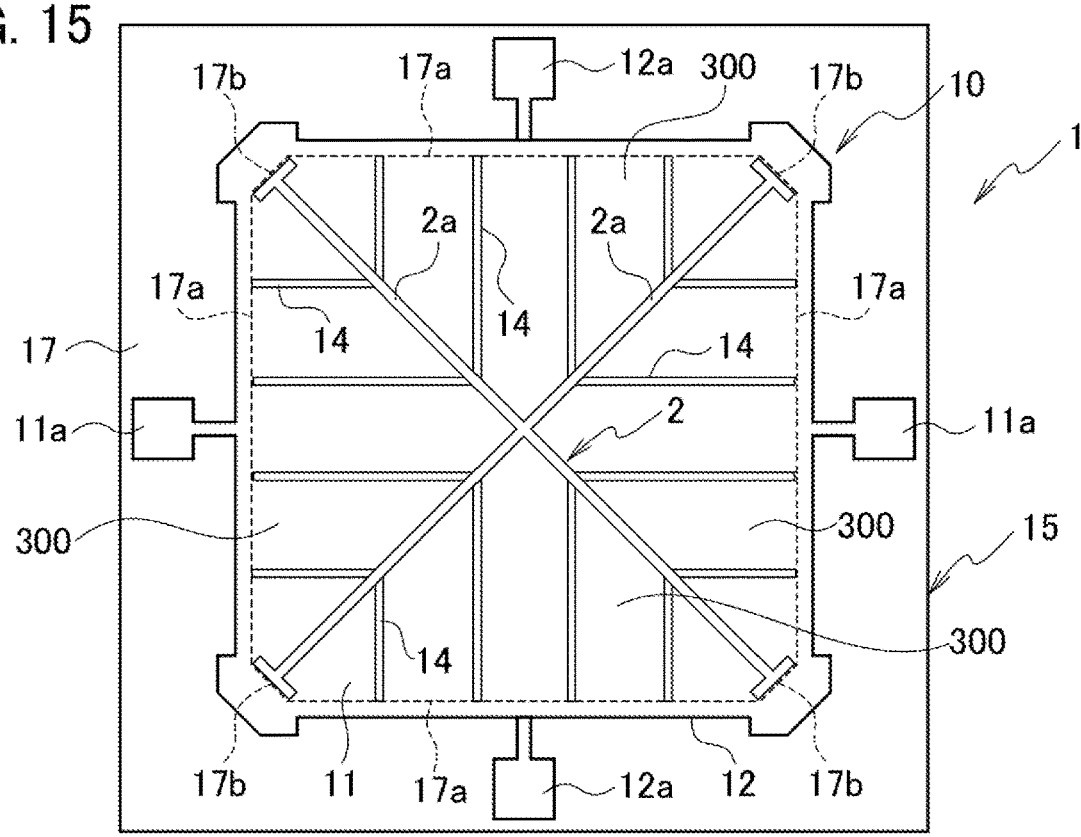
FIG. 15 is a top view of a transducer according to a third embodiment.

With reference to FIG. 15, a transducer 1 according to the present embodiment will be described. The transducer 1 according to the present embodiment differs from the transducer 1 according to the second embodiment in the configuration of a piezoelectric element 10. The description of content overlapping with that of the second embodiment will be omitted, and the description will be made with a focus on the differences below.

The piezoelectric element 10 includes piezoelectric slits 14 that penetrate the piezoelectric element 10 in the thickness direction. The piezoelectric slits 14 are provided for each vibration region 300. Specifically, the piezoelectric slits 14 extend from the flat portions 17a to the dividing slit 2 (main slit portions 2a) along the vertical direction of the flat portions 17a. Each vibration region 300 is divided into a plurality of small regions by means of the piezoelectric slits 14. The individual small regions are discontinuous in the direction parallel to the flat portions 17a (lateral direction).

The displacement of the vibration membrane 16 divided by the dividing slit 2 becomes larger from the flat portions 17a toward the distal end side. When the vibration membrane 16 is viewed along the lateral direction, it is ideal that the degree of displacement is the same at any position. However, during the repetition of the vibration by the vibration membrane 16, a warp occurs in the lateral direction, and distortion sometimes occurs in the vibration membrane 16.

In the present embodiment, the piezoelectric element 10 is divided in the lateral direction by the piezoelectric slits 14. Therefore, the occurrence of the warpage in the lateral direction of the vibration membrane 16 can be suppressed. This suppresses the occurrence of distortion in the vibration membrane 16. Accordingly, the vibration membrane 16 can be appropriately vibrated.

In this case, four piezoelectric slits 14 are provided in each vibration region 300. However, it is sufficient if one or more piezoelectric slits are provided in each region. Further, the number of piezoelectric slits 14 provided in each vibration region 300 may be different from each other.

Fourth Embodiment

Figure 16:
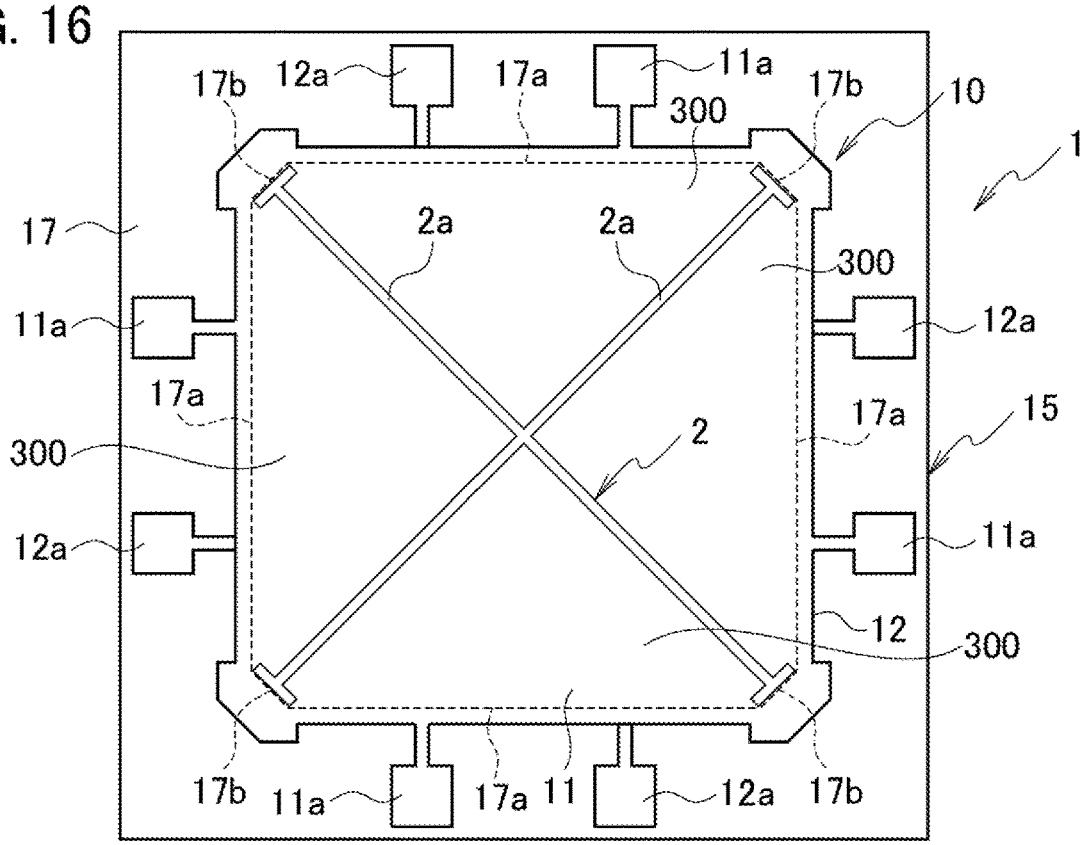
FIG. 16 is a top view of a transducer according to a fourth embodiment.

With reference to FIG. 16, a transducer 1 according to the present embodiment will be described. The transducer 1 according to the present embodiment differs from the transducer 1 according to the second embodiment in how electrodes 11 and 12 and electrode pads 11a and 12a are connected. Hereinafter, how the electrode 11 and the electrode pads 11a are connected will be described. The same applies to how the electrode 12 and the electrode pads 12a are connected. The description of the content overlapping with that of the second embodiment will be omitted, and the description will be focused on the differences.

An electrode pad 11a is provided for each vibration region 300 divided by the dividing slit 2. Specifically, there are four electrode pads 11a connected to the upper electrode 11. One electrode pad 11a is provided for one vibration region 300. Each electrode pad 11a is connected to the electrode 11 in the corresponding vibration region 300.

Suppose that an external force or the like acts on the membrane body 15 and distortion occurs. In the above case, a crack may occur at end portions of the dividing slit 2 and may be propagated to the electrode 11 from the end portions. Suppose that a crack occurs in both of opposing corner portions 17b. In the above case, the electrode 11 may be divided into two pieces and the current path may be blocked. Accordingly, the transducer 1 may not be driven.

In this regard, according to the present embodiment, an electrode pad 11a is provided for each of the four divided regions 300. Therefore, the electrode 11 can be connected to an electrode pad 11a provided for each of the four vibration regions 300. Even if the electrode 11 is divided into two, the application of a driving voltage can be continued for each divided region. This can continue the operation of the transducer 1.

In the present embodiment, one electrode pad 11a is provided for one vibration region 300. However, a pair of electrode pads 11a may be provided for one vibration region 300. This connects the electrode 11 with the pair of electrode pads 11a provided for each vibration region 300. Accordingly, even if the electrode 11 is divided due to a crack, the vibration membrane 16 can be vibrated for each individual vibration region 300.

Hereinafter, modified examples applicable to all of the second to fourth embodiments described above will be described. The following modified examples can be applied to all of the second to fourth embodiments, unless otherwise noted.

First Modified Example

Figure 17:
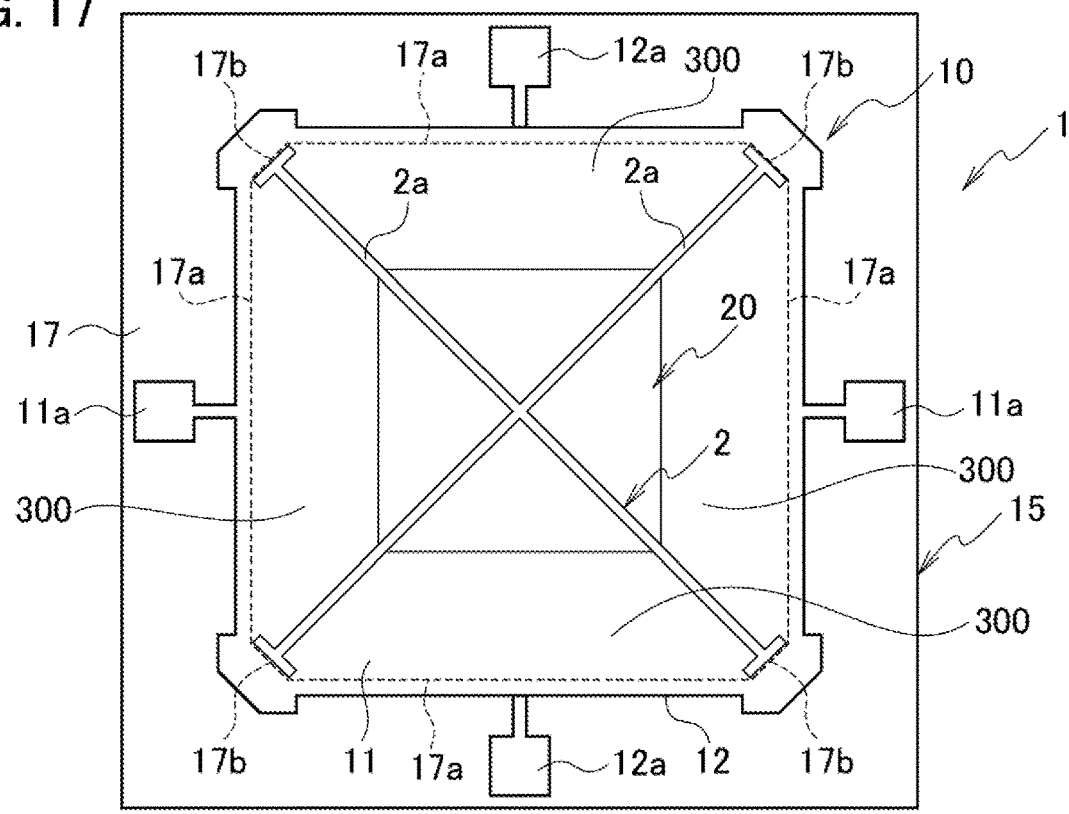
FIG. 17 is a top view of a transducer according to a first modified example.

With reference to FIG. 17, a transducer 1 according to a first modified example will be described. In the first modified example, a piezoelectric element 10 has an opening portion 20 in a central region corresponding to the center of the vibration membrane 16. The opening portion 20 penetrates the piezoelectric element 10 in the thickness direction. In FIG. 17, the opening portion 20 is formed in a square shape like the vibration membrane 16. That is, the piezoelectric element 10 is not provided in the central region of the vibration membrane 16. The piezoelectric element 10 is provided only in an outer region positioned outside the opening portion 20.

If the free end sides of the divided regions of the vibration membrane 16 are warped, a clearance occurs in the membrane thickness direction of the vibration membrane 16. The air moves through the clearance, and therefore air leakage occurs when the air is vibrated. According to the configuration of the first modified example, warpage on the free end sides of the vibration membrane 16 can be suppressed. This can suppress the movement of the air caused by the warpage of the vibration membrane 16. Accordingly, the air can be efficiently vibrated.

Second Modified Example

Figure 18:
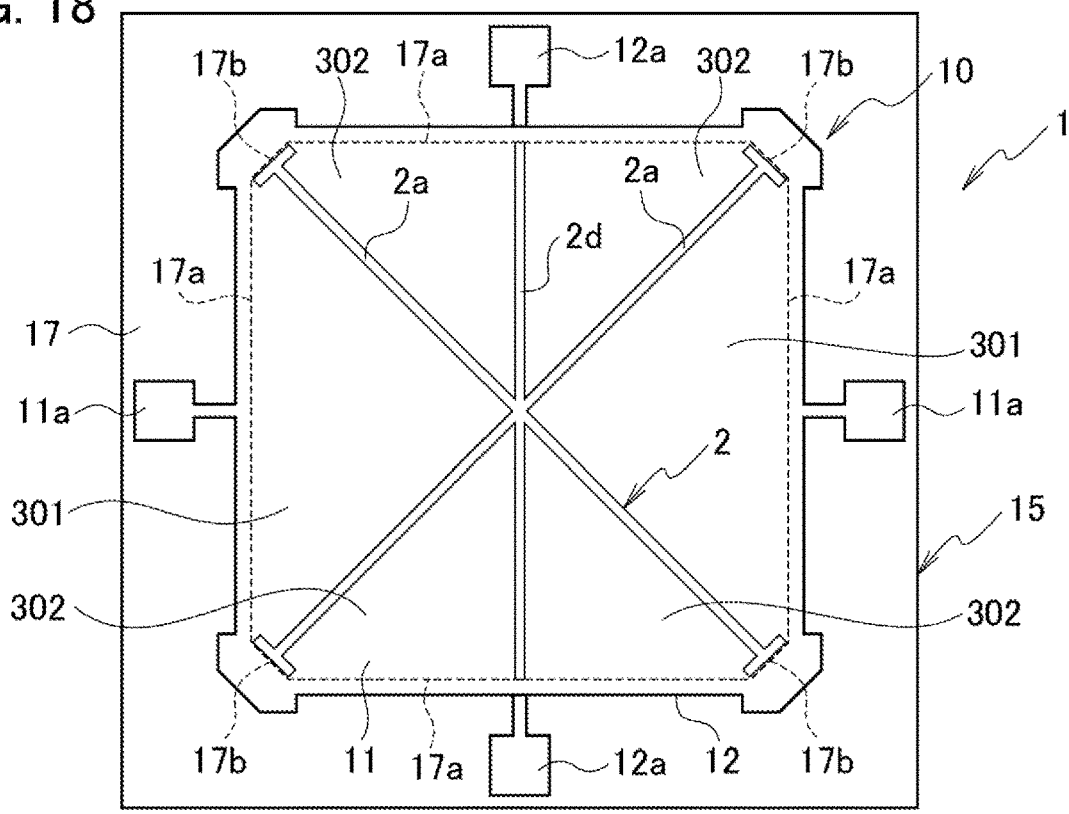
FIG. 18 is a top view of a transducer according to a second modified example.

With reference to FIG. 18, a transducer 1 according to a second modified example will be described. In the second modified example, the dividing slit 2 further includes third slit portions 2d, the third slit portions 2d dividing a vibrator formed by laminating the vibration membrane 16 and the piezoelectric element 10. The third slit portions 2d extend from the center of the vibration membrane 16 toward center positions of the flat portions 17a. The third slit portions 2d are not provided at all of the four flat portions 17a. In the example shown in FIG. 18, the third slit portions 2d are provided only at two opposing flat portions 17a.

In this manner, the vibrator formed by laminating the vibration membrane 16 and the piezoelectric element 10 is divided into six vibration regions by the main slit portions 2a and the third slit portions 2d. Specifically, the six vibration regions include first vibration regions 301 and second vibration regions 302. The first vibration regions 301 are positioned between the pair of main slit portions 2a. The second vibration regions 302 are positioned between the main slit portions 2a and the third slit portions 2d. The second vibration regions 302 are formed into a shape different from that of the first vibration regions 301 due to the division. Specifically, the second vibration regions 302 are formed into a triangular shape having an angle on the distal end side which is smaller than that of the first vibration regions 301.

According to this configuration, the shapes of the first vibration regions 301 and the second vibration regions 302 are different. This causes deviation in the resonance frequencies of both of the vibration regions 301 and 302. As a result, a wider range of output characteristics can be obtained as compared with the case where the shapes of all the vibration regions are the same.

In the present embodiment, the plurality of vibration regions are formed to have two types of shapes, but they may have three or more types of shapes. Further, the shapes of the plurality of vibration regions may be all different from each other.

Third Modified Example

Figure 19:
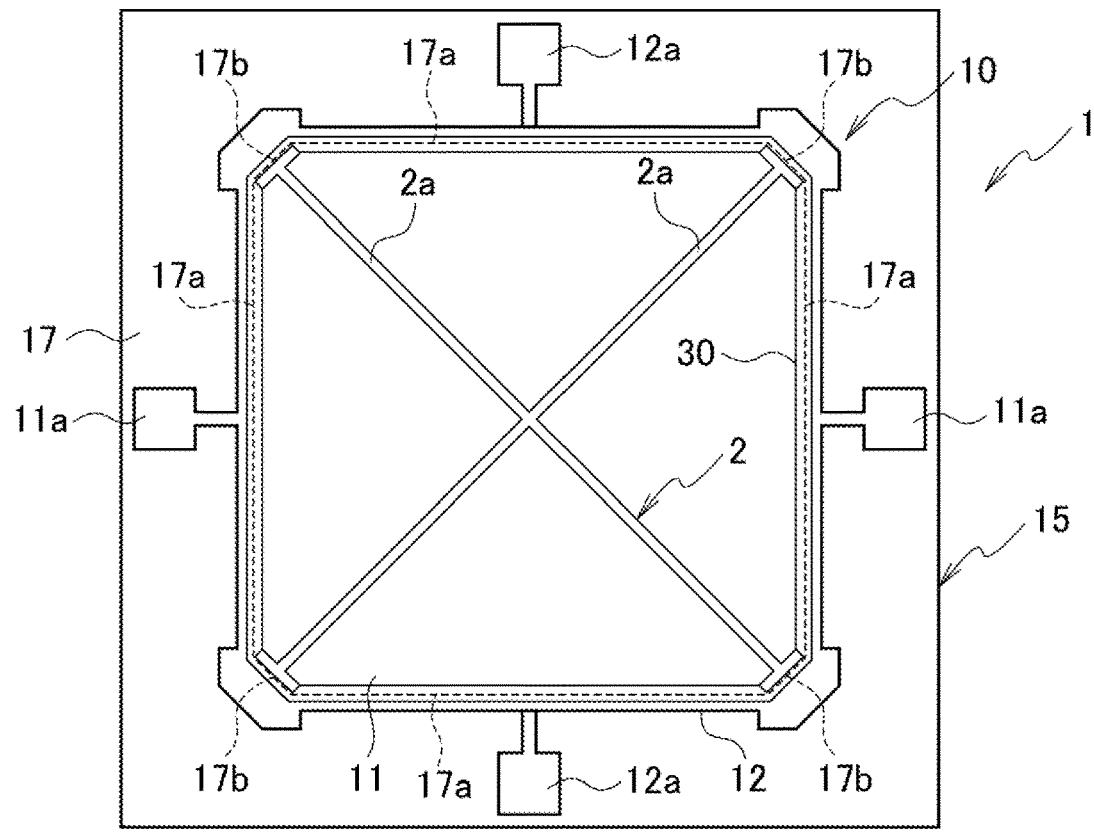
FIG. 19 is a top view of a transducer according to a third modified example.
Figure 20A:
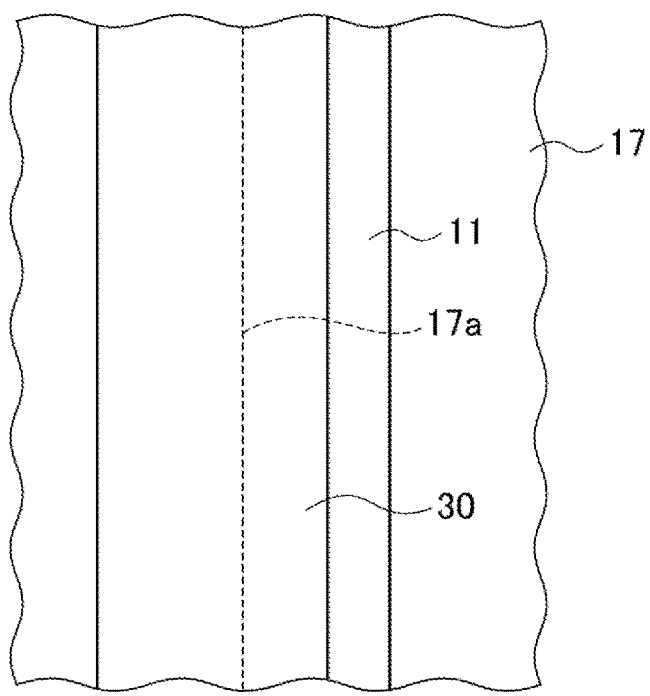
FIG. 20A is an enlarged view showing a main part of the transducer shown in FIG. 19.
Figure 20B:
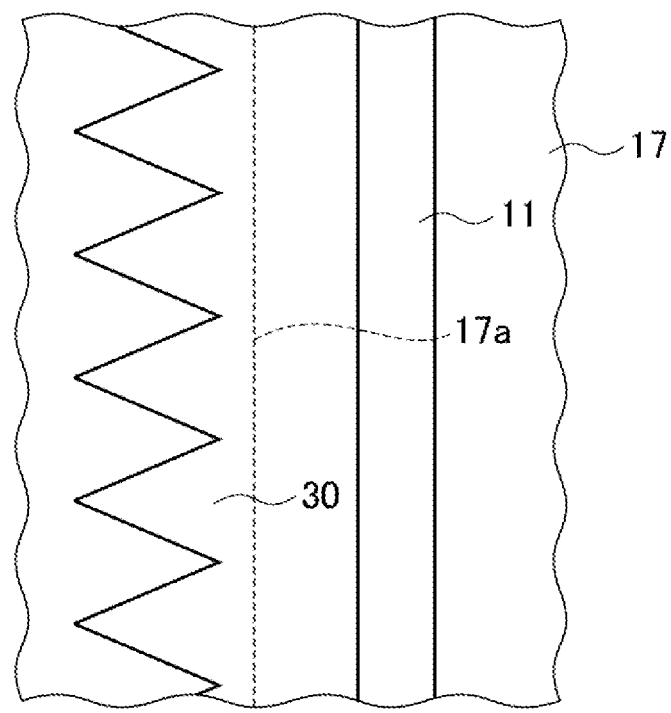
FIG. 20B is a diagram for explaining a modified example of the structure shown in FIG. 20A.
Figure 21:
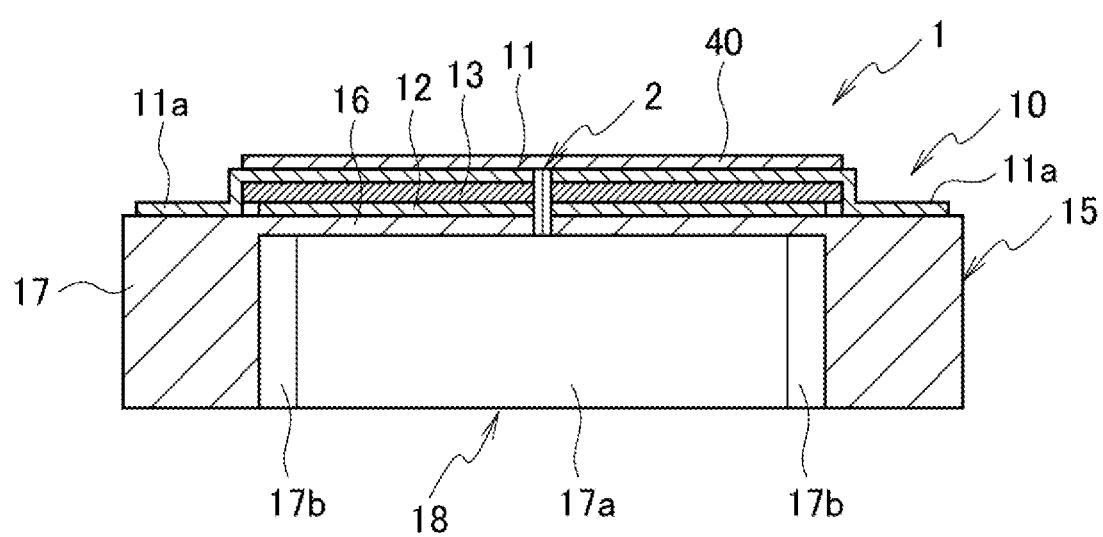
FIG. 21 is a cross-sectional view of a transducer according to a fourth modified example.

With reference to FIGS. 19, 20A, and 20B, a transducer 1 according to a third modified example will be described. In this third modified example, the transducer 1 includes a membrane body protective layer 30 which is laminated on the piezoelectric element 10. The membrane body protective layer 30 has a function of protecting a connecting portion between the vibration membrane 16 and the inner peripheral surface. The membrane body protective layer 30 is a thin membrane formed of a soft material having elasticity, for example, a resin. The membrane body protective layer 30 is disposed with a predetermined width along the inner peripheral surface (flat portions 17*a* and corner portions 17*b*) of the membrane support portion 17, which forms the cavity 18. However, alternatively the membrane body protective layer 30 may be provided so as to cover the entire surface of the piezoelectric element 10.

Suppose that the vibration membrane 16 is displaced to a large extent or the membrane body 15 receives an impact or the like. In the above case, a crack or the like may occur in a connecting portion between the vibration membrane 16 and the inner peripheral surface. However, according to the present embodiment, the membrane body protective layer 30 covers the connecting portion, and therefore the membrane body 15 can be protected and prevented from being broken.

The membrane body protective layer 30 is for protecting the connecting portion between the vibration membrane 16 and the inner peripheral surface. Therefore, it is sufficient if the protective performance can be obtained at least at the connecting portion. Accordingly, the membrane body protective layer 30 may have a shape in which a part of the membrane body protective layer 30 is thinned from the inner peripheral surface toward the inner side. In the example shown in FIG. 20B, in the membrane body protective layer 30, triangular slits are continuously provided along the circumferential direction, for example.

Fourth Modified Example

Figure 22A:
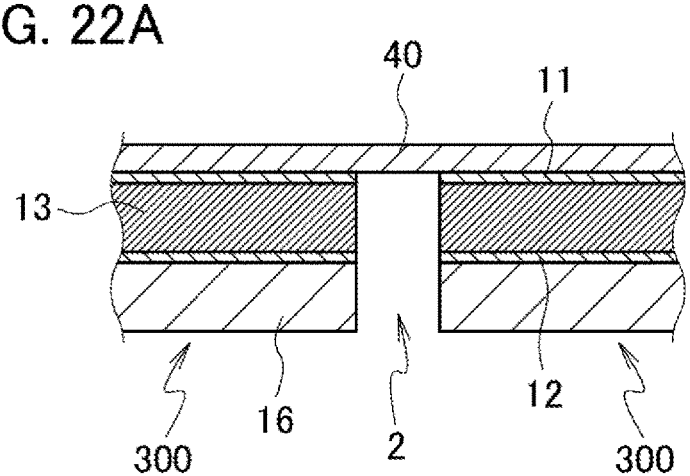
FIG. 22A is an enlarged view of a main part of the transducer shown in FIG. 21.

With reference to FIGS. 21 and 22A to 22C, a transducer 1 according to a fourth modified example will be described. In the fourth modified example, the transducer 1 includes a cover layer 40 which is laminated on the piezoelectric element 10. The cover layer 40 is provided so as to cover, for example, the entire area of the piezoelectric element 10. However, it is sufficient if the cover layer 40 is present in a range covering at least the dividing slit 2. The cover layer 40 is a thin membrane formed of a soft material, such as a resin, which expands and contracts in accordance with the displacement of the vibration membrane 16. In FIG. 22A, the cover layer 40 positioned on the dividing slit 2 is provided in a planar manner so as to cover the upper portion of the dividing slit 2.

According to this configuration, the dividing slit 2 is covered with the cover layer 40. Therefore, the movement of air from one side to the other opposite side of the vibration membrane 16 can be suppressed. This can suppress the movement of the air through the dividing slit 2. Therefore, the air can be efficiently vibrated. Further, distal ends which are formed into a cantilever shape are connected to each other. Accordingly, it is possible to suppress a sudden displacement of the distal ends which is caused when a strong external impact is received. This can suppress the breakage of the vibration membrane 16 such as folding of the vibration membrane 16.

Figure 22B:
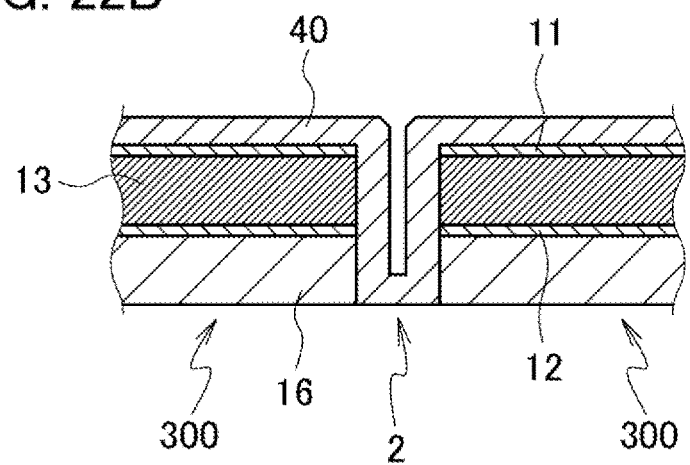
FIG. 22B is a diagram for explaining a modified example of the structure shown in FIG. 22A.
Figure 22C:
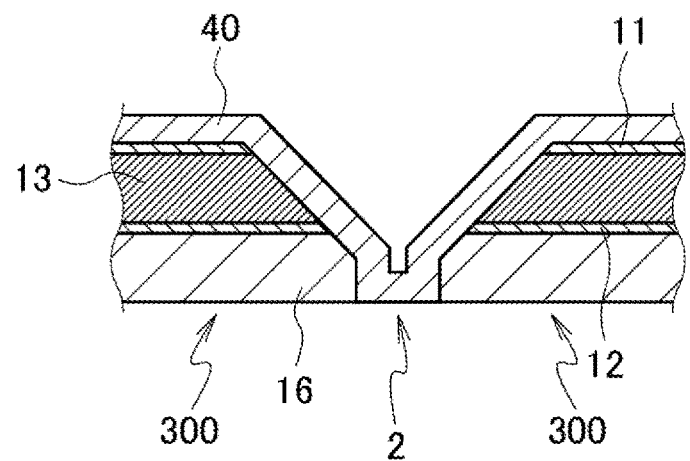
FIG. 22C is a diagram for explaining a modified example of the structure shown in FIG. 22A.

As shown in FIG. 22B, the cover layer 40 may be provided so as to follow along a vertical groove in the dividing slit 2. In this configuration, if the vibration membrane 16 is displaced, the cover layer 40 is peeled off from the vertical groove in the dividing slit 2. Accordingly, the displacement of the vibration membrane 16 can be tolerated. The cover layer 40 can be formed as follows: first the dividing slit 2 is formed in the vibrator formed by laminating the vibration membrane 16 and the piezoelectric element 10, and then the cover layer 40 is deposited in a thin membrane shape. Further, as shown in FIG. 22B, the distal end side of the vibration regions 300 may be chamfered such that the thickness decreases from a non-center position toward the center of the vibration membrane 16.

Fifth Modified Example

Figure 23A:
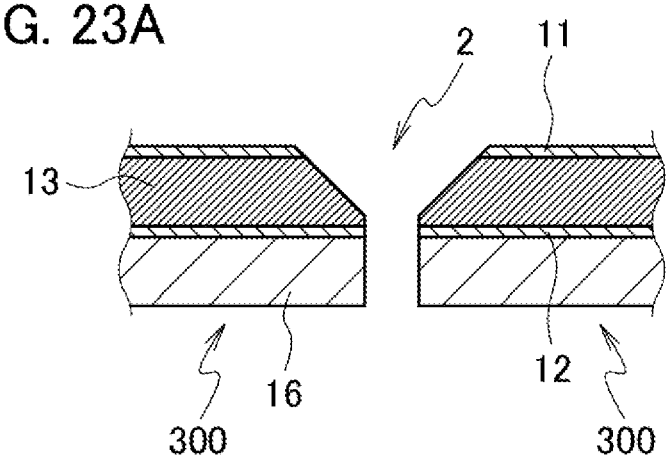
FIG. 23A is an enlarged cross-sectional view showing a main part of a transducer according to a fifth modified example.
Figure 23B:
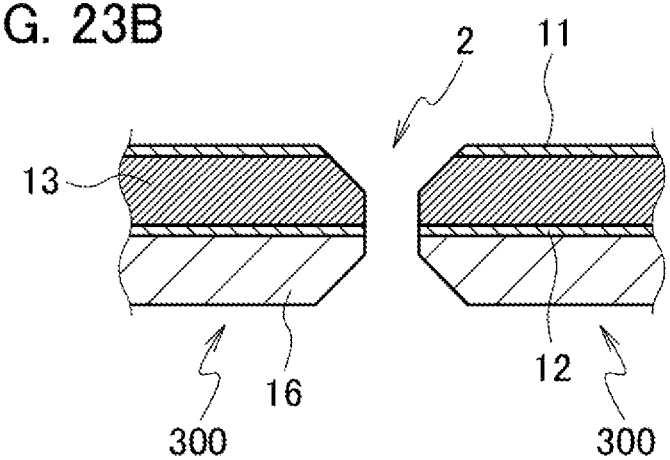
FIG. 23B is a diagram for explaining a modified example of the structure shown in FIG. 23A.
Figure 23C:
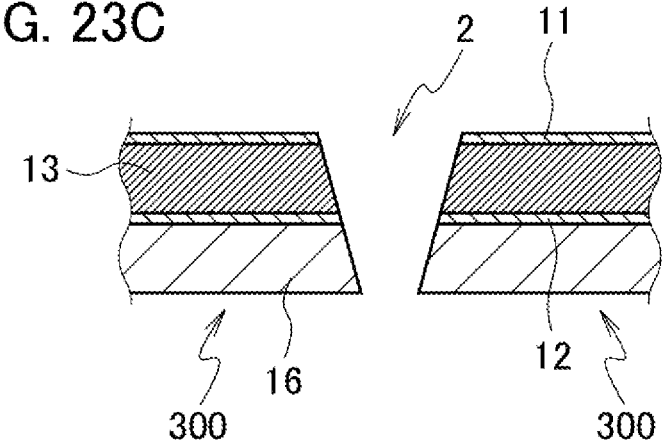
FIG. 23C is a diagram for explaining a modified example of the structure shown in FIG. 23A.

With reference to FIGS. 23A to 23C, a transducer 1 according to a fifth modified example will be described. FIG. 23A shows distal end sides of a pair of vibration regions 300 which face each other. In the fifth modified example, each of the four vibration regions 300 is chamfered such that the thickness of the distal ends decreases from a non-center position toward the center of the vibration membrane 16. In the example shown in FIG. 23A, the upper surface sides of the distal ends of the vibration regions 300 are chamfered.

Suppose that the pair of facing vibration regions 300 are displaced from each other. In the above case, the distal ends of the vibration regions 300 may collide with each other. Therefore, by chamfering the distal ends of the vibration region 300, clearances for releasing the distal ends are generated. Accordingly, that collision can be suppressed. This can suppress the breakage of the vibration membrane 16.

The portion to be chamfered is not limited to the upper surface side of the distal ends of the vibration regions 300. Both of the upper surface side and the lower surface side of the distal ends may be chamfered (see FIG. 23B). The chamfering method of the distal ends may be a method of continuously chamfering from the upper surface to the lower surface (see FIG. 23C).

Sixth Modified Example

Figure 24:
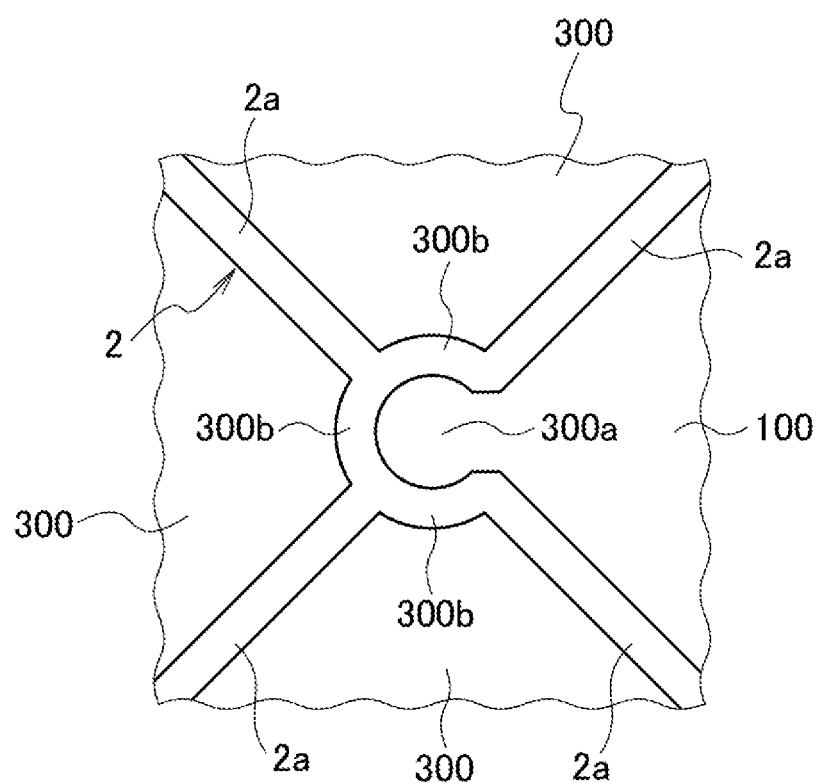
FIG. 24 is an enlarged top view showing a main part of a transducer according to a sixth modified example.

With reference to FIG. 24, a transducer 1 according to a sixth modified example will be described. This sixth modified example is characterized by the distal end shape of the vibration regions 300.

In the sixth modified example, a circular projection 300*a* is provided at a distal end of any one of the four vibration regions 300. The projection 300*a* extends to the center of the vibration membrane 16. Meanwhile, notches 300*b* are provided at distal ends of the remaining three vibration regions 300 out of the four vibration regions 300. The notches 300*b* are cut in an arc shape so as to surround the projection 300*a*.

The notches 300*b* are provided in accordance with the shape of the projection 300*a*. Therefore, it is possible to prevent the distal ends of the vibration regions 300 from colliding with each other. This can suppress the breakage of the vibration membrane 16. Further, the presence of the projection 300*a* can close the clearance in the center of the vibration membrane 16. As a result, the movement of the air from one side to the other opposite side of the vibration membrane 16 can be suppressed. Accordingly, the air can be effectively vibrated by the vibration membrane 16.

Although the first to sixth modified examples have been described as above, the first to sixth modified examples can be made by combining technical features shown in the individual modified examples.

Fifth Embodiment

Figure 25:
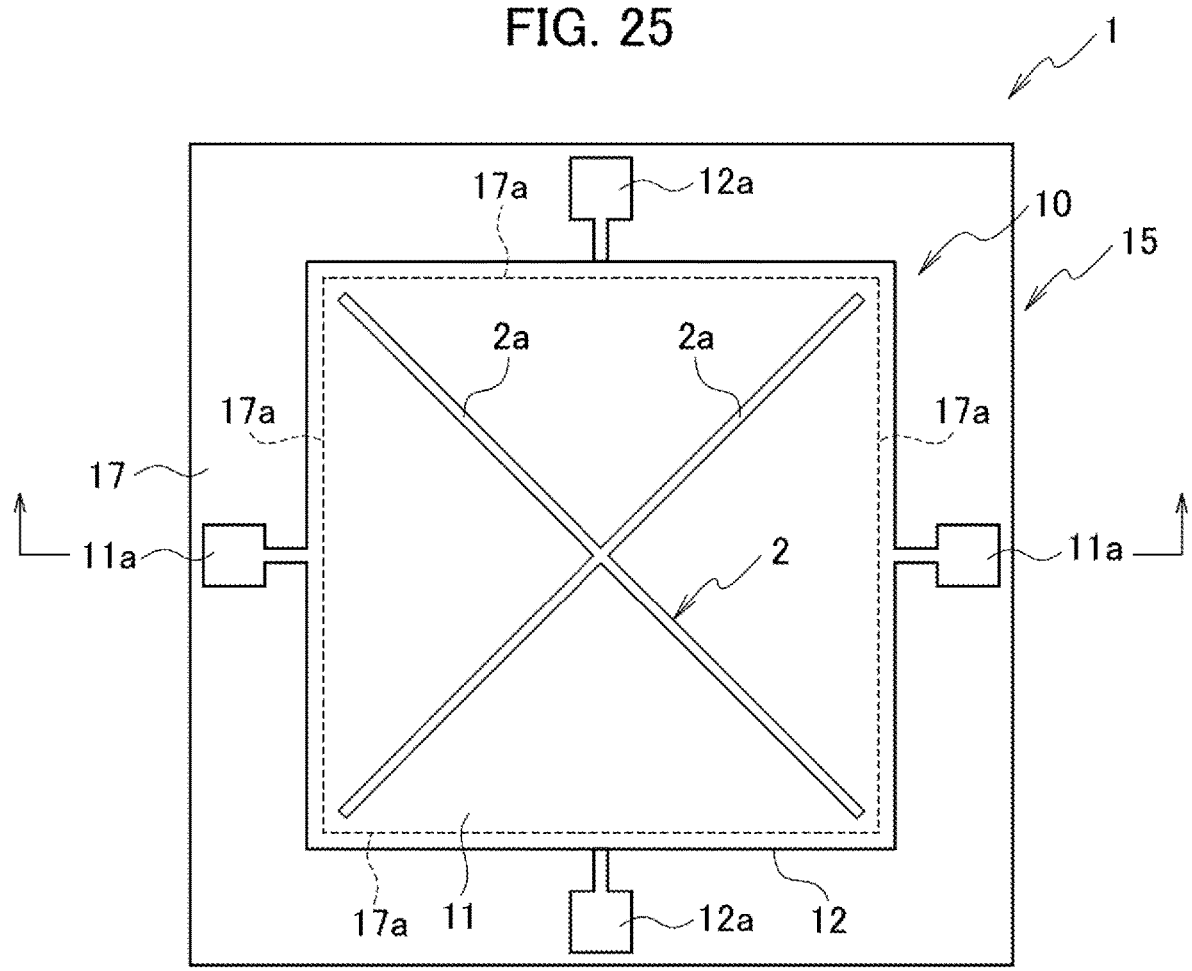
FIG. 25 is a top view of a transducer according to a fifth embodiment.
Figure 26:
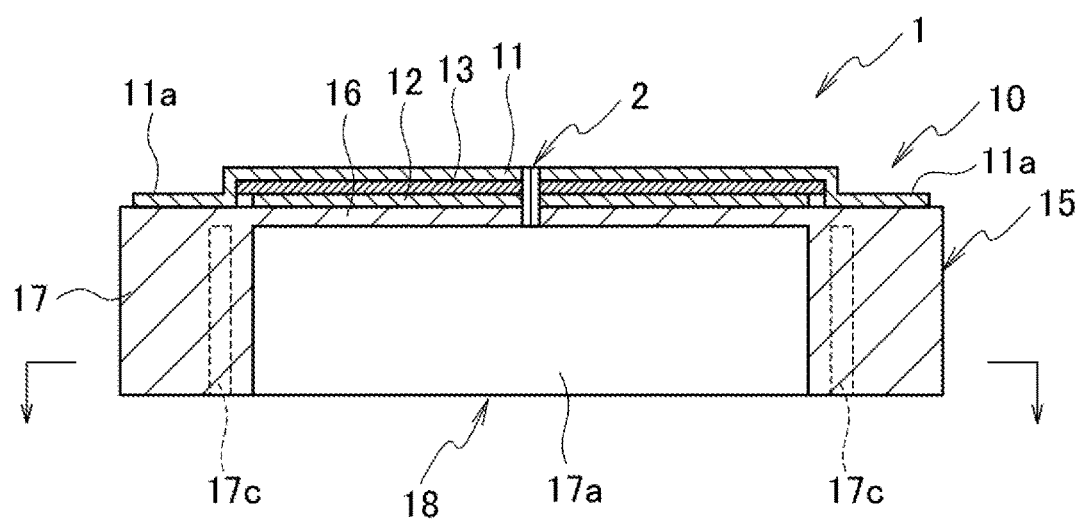
FIG. 26 is a cross-sectional view taken along the direction of an arrow in FIG. 25.
Figure 27:
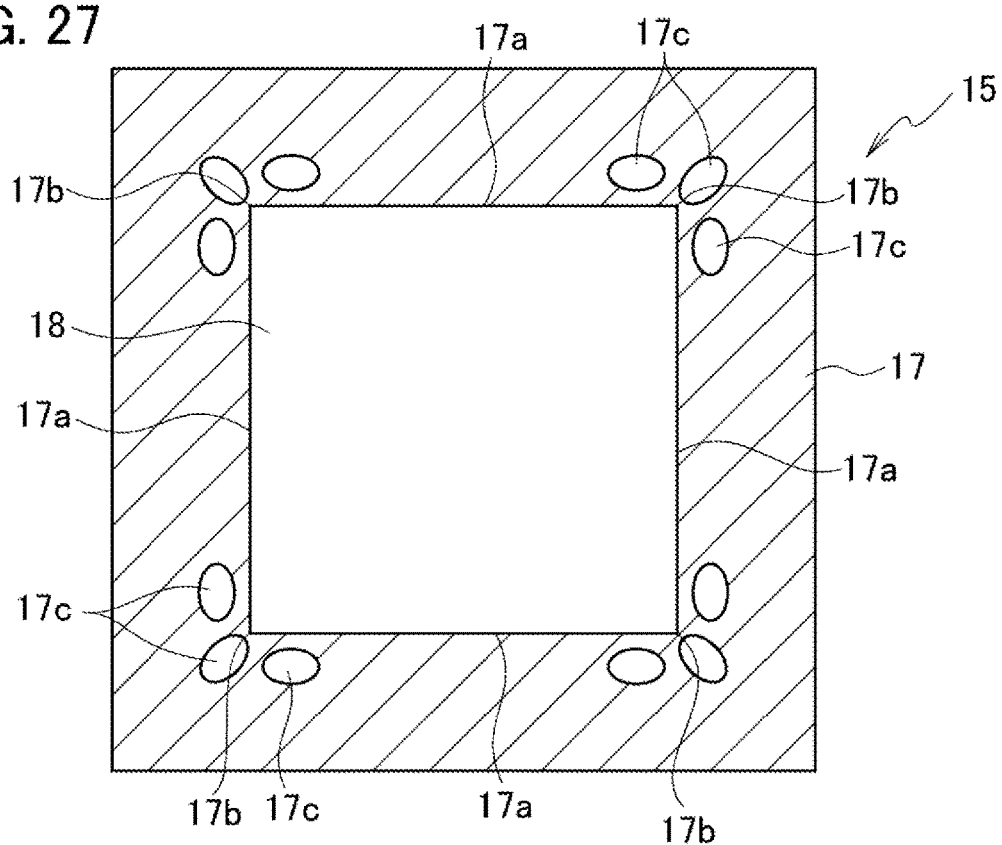
FIG. 27 is a cross-sectional view taken along the direction of an arrow in FIG. 26.

A transducer 1 according to the present embodiment will be described with reference to FIGS. 25 to 27 below. The transducer 1 according to the present embodiment differs from the transducer 1 according to the second embodiment in the configuration of a membrane support portion 17. The description of the content overlapping with that of the second embodiment will be omitted, and the description will be made with a focus on the differences.

In the present embodiment, corner portions 17b which form a cavity 18 have a shape corresponding to an inner angle of a square shape. That is, adjacent flat portions 17a are connected at 90 degrees through each corner portion 17b. In the membrane support portion 17, three small cavities 17c are provided around each corner portion 17b. The small cavities 17c are hollow portions which extend in the membrane thickness direction of the vibration membrane 16. The individual small cavities 17c are independent of each other and are provided at positions not connected to the cavity 18.

The small cavities 17c extend from the lower surface side to the upper surface side of the membrane support portion 17. The small cavities 17c are formed to have a height (depth) which is low enough to not penetrate the membrane support portion 17. When viewed in a plane parallel to the vibration membrane 16, each small cavity 17c has a circular or elliptical shape.

If the inner peripheral surface is formed into a polygonal shape, the stress occurring at the membrane body 15 is concentrated at the corner portions 17b. Therefore, in the present embodiment, the stress concentrated at the corner portions 17b is alleviated by providing the small cavities 17c around each corner portion 17b. In addition, suppose that a crack occurs at each corner portion 17b. Even in the above case, the progress of a crack can be received by the small cavities 17c formed of curved surfaces which are present around each corner portion 17b. This can prevent the membrane support portion 17 from being broken to a large extent.

Figure 28A:
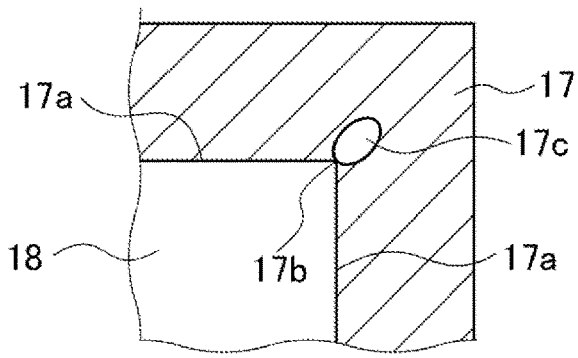
FIG. 28A is a diagram for explaining a modified example of the structure shown in FIG. 27.
Figure 28B:
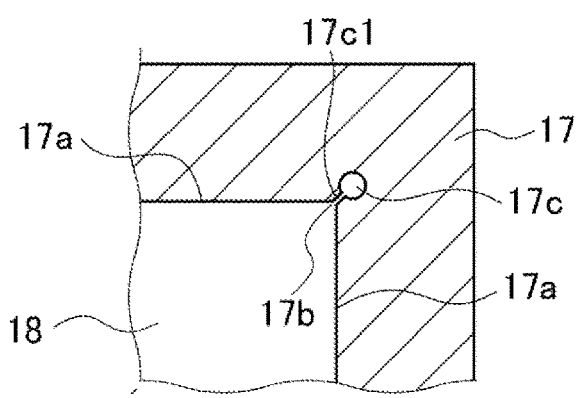
FIG. 28B is a diagram for explaining a modified example of the structure shown in FIG. 27.

As shown in FIGS. 28A and 28B, each small cavity 17c may be connected to the cavity 18. In the example shown in FIG. 28A, each small cavity 17c and the cavity 18 are in direct communication with each other. In the example shown in FIG. 28B, each small cavity 17c and the cavity 18 are in communication with each other with a slit-like communication portion 17c1 therebetween.

Sixth Embodiment

Figure 29:
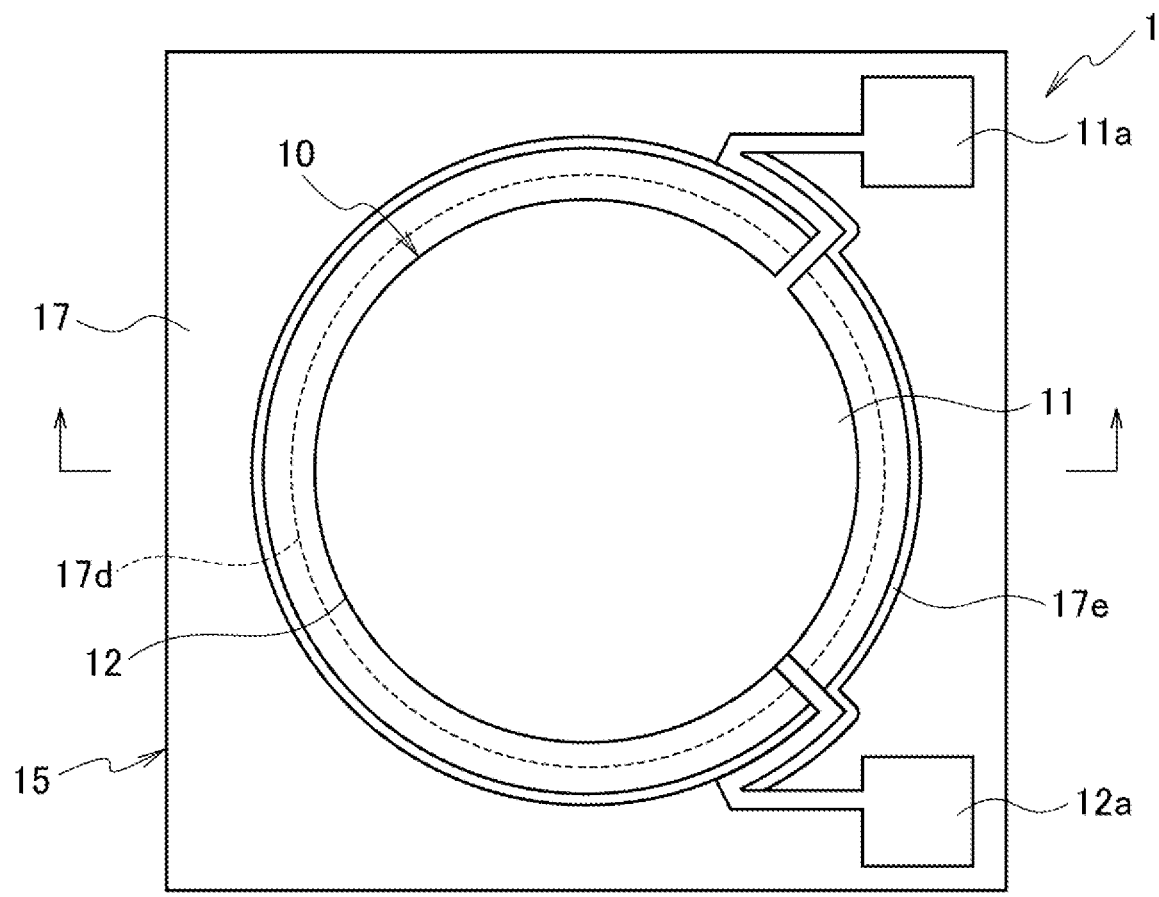
FIG. 29 is a top view of a transducer according to a sixth embodiment.
Figure 30:
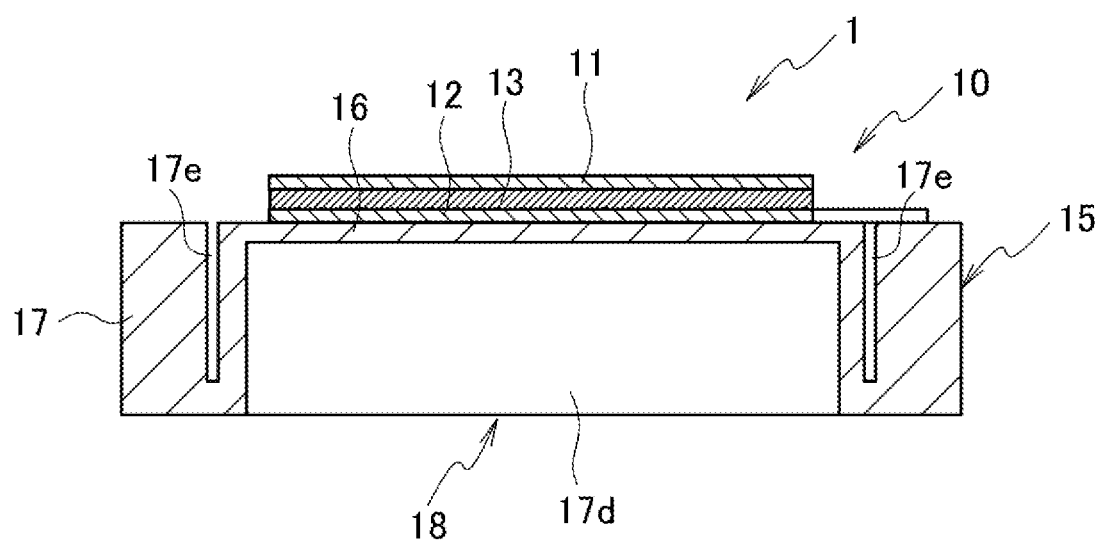
FIG. 30 is a cross-sectional view taken along the direction of an arrow in FIG. 29.

Hereinafter, a transducer 1 according to the present embodiment will be described with reference to FIGS. 29 and 30. The transducer 1 according to the present embodiment differs from the transducer 1 according to the second embodiment in the configuration of a membrane support portion 17. The description of the content overlapping with that of the second embodiment will be omitted, and the description will be made with a focus on the differences below. FIG. 29 does not show some electrode pads 11a and 12a.

In the present embodiment, the membrane support portion 17 has an inner peripheral surface forming the cavity 18. The inner peripheral surface is formed of one curved surface portion 17d and has a circular shape. On the upper surface side of the membrane support portion 17, groove portions 17e which have a depth shallow enough to not penetrate the membrane support portion 17 are formed. The groove portions 17e are positioned outside the curved surface portion 17d and formed so as to surround the periphery of the curved surface portion 17d.

Further, in order to protect wiring for connecting the electrodes 11 and 12 with the electrode pads 11a and 12a, groove portions 17e are not formed at wiring locations. Instead, at the wiring locations, groove portions 17e are provided on the outer peripheral side of the wiring, and the groove portions 17e are arranged in a doubled manner.

According to such a configuration, groove portions 17e are formed on the upper surface of the membrane support portion 17 so as to surround the periphery of the vibration membrane 16. This allows inward bending of a region of the membrane support portion 17 which is inside the groove portions 17e. As a result, the region inside the groove portions 17e can be displaced inward in accordance with the displacement of the vibration membrane 16. Accordingly, the amount of bend of the vibration membrane 16 can be increased. This can displace the vibration membrane 16 to a large extent. Therefore, the air can be efficiently vibrated.

Seventh Embodiment

Figure 31:
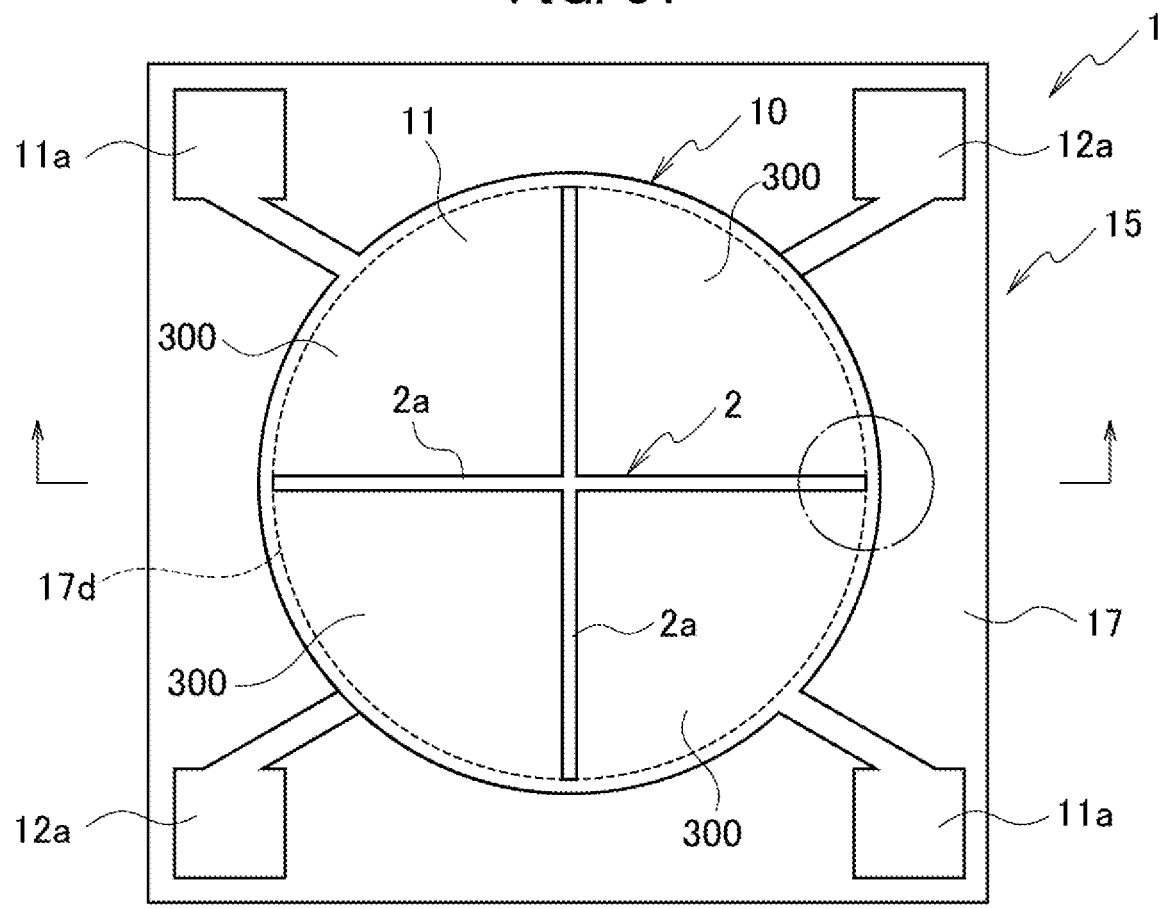
FIG. 31 is a top view of a transducer according to a seventh embodiment.
Figure 32:
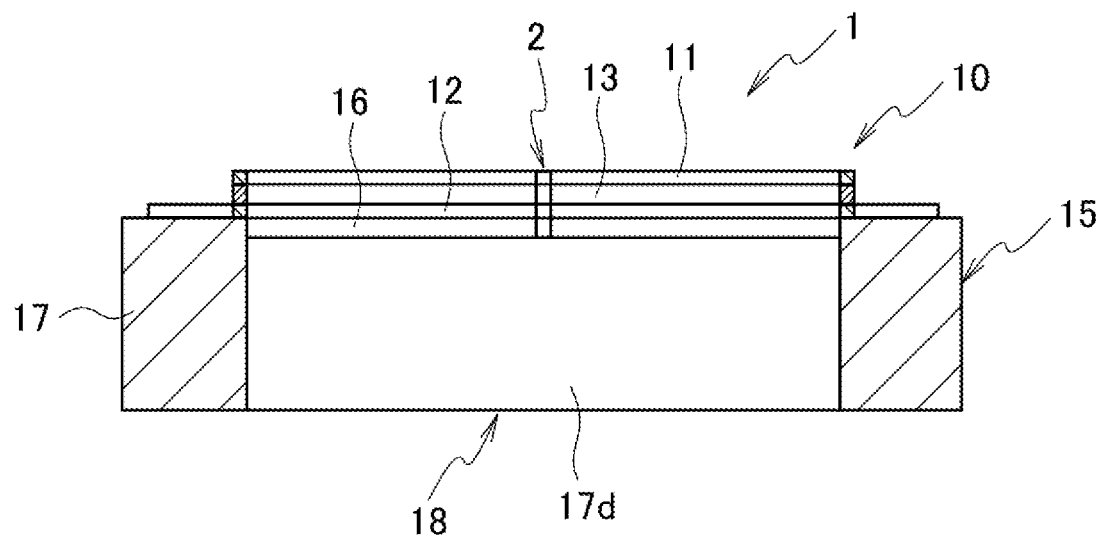
FIG. 32 is a cross-sectional view taken along the direction of an arrow in FIG. 31.

A transducer 1 according to the present embodiment will be described below with reference to FIGS. 31 to 33. The transducer 1 according to the present embodiment differs from the transducer 1 according to the second embodiment in the configuration of a dividing slit 2. The description of the content overlapping with that of the second embodiment will be omitted, and the description will be made with a focus on the differences below.

In the present embodiment, a membrane support portion 17 has an inner peripheral surface forming a cavity 18. The inner peripheral surface is constituted of one curved surface portion 17d and has a circular shape. The transducer 1 includes the dividing slit 2. The dividing slit 2 divides a vibrator formed by laminating a piezoelectric element 10 and a vibration membrane 16 into a plurality of vibration regions 300.

The dividing slit 2 includes four main slit portions 2a. The main slit portions 2a extend from the center of the vibration membrane 16 toward the curved surface portion 17d. The four main slit portions 2a are distributed radially. This divides the vibrator formed by laminating the piezoelectric element 10 and the vibration membrane 16 into four vibration regions 300. As shown in FIG. 33, an end portion of each main slit portion 2a on the side of the curved surface portion 17d is formed in a curved shape.

Figure 33:
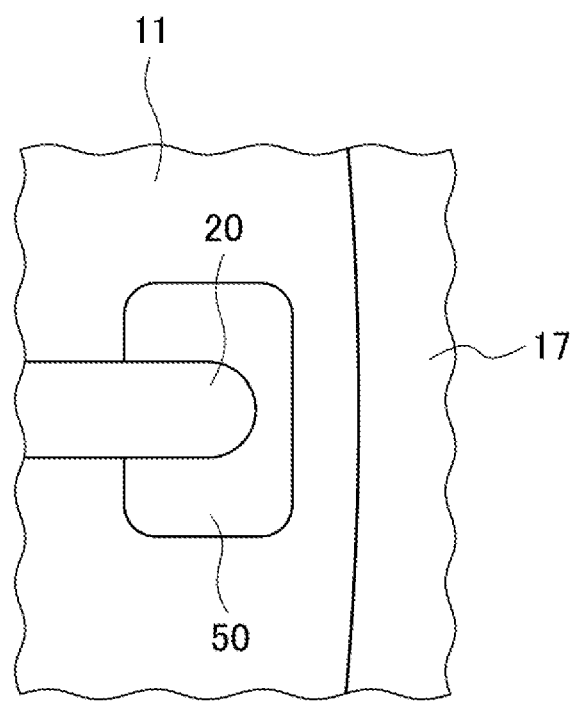
FIG. 33 is an enlarged top view showing a region surrounded by a dot-dash line of FIG. 31.

Further, as shown in FIG. 33, a slit protective layer 50 is provided at an end portion of each main slit portion 2a on the side of the curved surface portion 17d. The slit protective layers 50 are large enough to surround end portions of the main slit portions 2a. Each slit protective layer 50 is a thin membrane formed of a soft material. The slit protective layers 50 may be formed of a material which is the same as that of either one of the electrodes 11 and 12 or the piezoelectric membrane 13. In this case, it is not necessary to prepare a unique material for the slit protective layers 50. Therefore, it is possible to suppress the manufacturing process of the transducer 1 becoming complex.

If end portions of the main slit portions 2a are formed of corner portions at right angles, there is a risk that stress may be concentrated at the corner portions. However, according to the present embodiment, the end portions of the main slit portions 2a are formed in a curved shape. Therefore, it is possible to suppress a situation in which stress concentrates at a specific location of an end portion of each main slit portion 2a. This can suppress the occurrence of a crack from an end portion of each main slit portion 2a.

An end portion of each main slit portion 2a may have a shape other than a curved shape. The end portion may have a polygonal shape which is formed by combining three or more straight lines, for example. Further, the end portion may have a shape obtained by combining a curved shape and a polygonal shape, for example. The shape may be a combination of two or more curve lines and one or more straight lines, or a combination of one or more curve lines and two or more straight lines.

Further, in the present embodiment, a slit protective layer 50 is disposed at an end portion of each main slit portion 2*a*. The end portions of the main slit portions 2*a* are protected by the slit protective layers 50. This can suppress the occurrence of a crack from the end portions of the main slit portions 2*a*.

In the method of the present embodiment, the inner peripheral surface forming the cavity 18 has a circular shape. However, the inner peripheral surface may alternatively have a polygonal shape.

Eighth Embodiment

Figure 34:
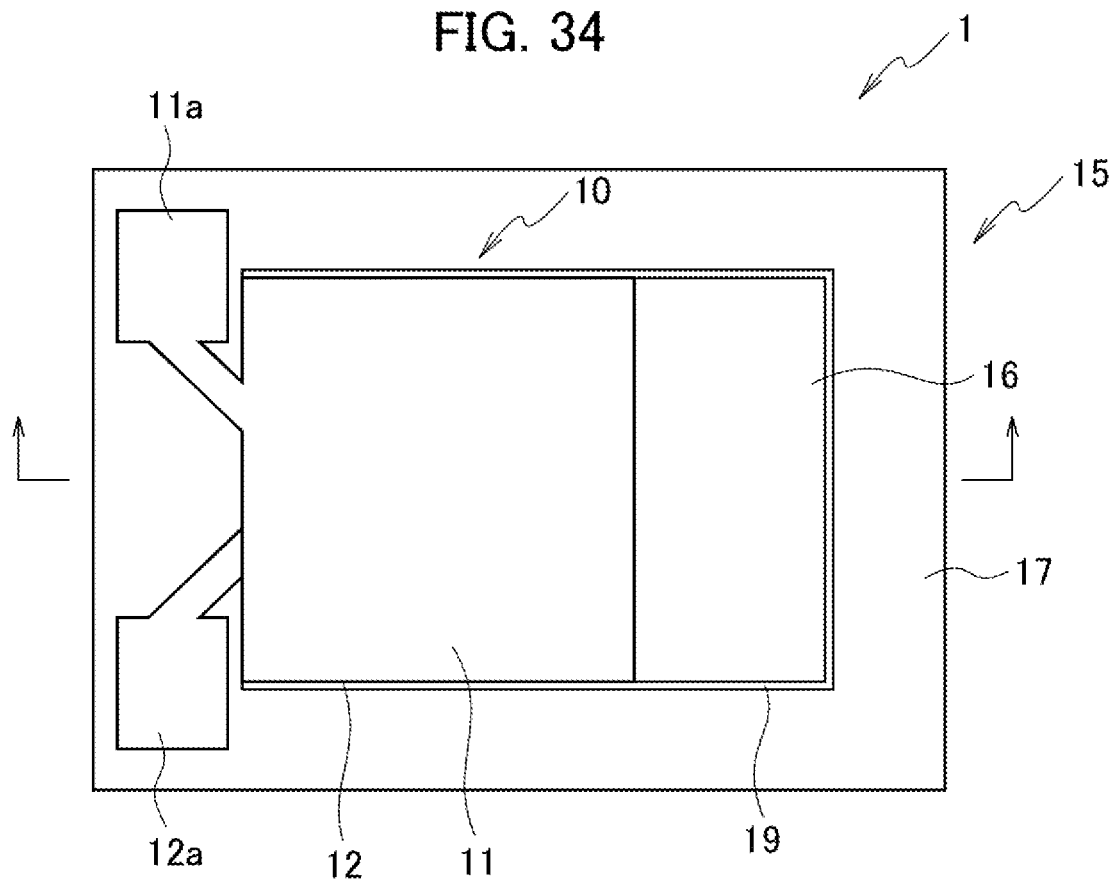
FIG. 34 is a top view of a transducer according to an eighth embodiment.
Figure 35:
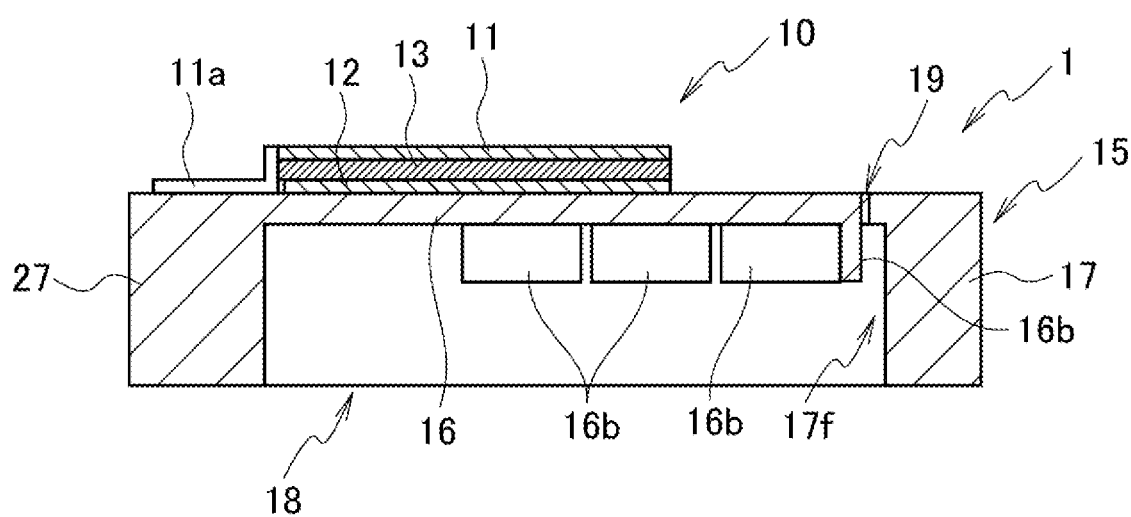
FIG. 35 is a cross-sectional view taken along the direction of an arrow in FIG. 34.

A transducer 1 according to the present embodiment will be described with reference to FIGS. 34 to 35 below. The transducer 1 according to the present embodiment differs from the transducer 1 according to the second embodiment in an operating structure of a vibration membrane 16. The description of the content overlapping with that of the present embodiment will be omitted, and the description will be made with a focus on the differences below. FIG. 34 does not show some electrode pads 11*a* and 12*a*.

In the present embodiment, a membrane body 15 includes a cantilever type vibration membrane 16 and a membrane support portion 17. The vibration membrane 16 has a substantially square shape when viewed in a plane parallel to the vibration membrane 16. The membrane support portion 17 surrounds the periphery of the vibration membrane 16 and is connected to one side of the vibration membrane 16. A clearance 19 is set between the remaining three sides of the vibration membrane 16 and the membrane support portion 17. That is, the vibration membrane 16 is supported in a cantilever shape.

The piezoelectric element 10 is not provided on the free end side of the vibration membrane 16, but is provided on the base end side connected to the membrane support portion 17. When a driving voltage is applied to each of a pair of electrodes 11 and 12, a potential difference occurs between the pair of electrodes 11 and 12. Due to this potential difference, the free end side of the vibration membrane 16 is displaced in the membrane thickness direction. By repeatedly applying a driving voltage to the pair of electrodes 11 and 12, the vibration membrane 16 alternately repeats displacement to the upper side and displacement to the lower side. Due to the vibration of the vibration membrane 16, the air around the vibration membrane 16 is vibrated, and the vibration of the air is output as sound waves.

As one of the features of the present embodiment, screens 16*b* are provided at three sides of the vibration membrane 16 which are separated from the membrane support portion 17 by means of the clearance 19. The screens 16*b* are provided on a surface opposite to the piezoelectric element 10 and extend toward the cavity 18. The screens 16*b* provided at the side positioned on the free end side are continuously formed along the side. Meanwhile, the screens 16*b* provided at the two sides connecting the free end side and the base end side are intermittently provided at predetermined intervals (slits).

A space portion 17*f* is formed in a surface of the membrane support portion 17 which faces the free end side of the vibration membrane 16. The space portion 17*f* is formed such that an upper portion of the membrane support portion 17 remains.

When the free end side of the vibration membrane 16 is warped, a clearance occurs in the membrane thickness direction of the vibration membrane 16. Air moves through the clearance. Therefore, air leakage increases when the air is vibrated. However, according to the present embodiment, the screens 16*b* are provided on the lower surface of the vibration membrane 16. The formation of a clearance is suppressed by means of the screens 16*b*. Therefore, the air can be suppressed from coming out.

The screens 16*b* are intermittently formed on the side at which the vibration membrane 16 warps. Accordingly, the screens 16*b* do not inhibit the displacement of the vibration membrane 16. As a result, the vibration of the vibration membrane 16 can be tolerated.

In addition, by providing the space portion 17*f* in the membrane support portion 17, it is possible to prevent the screens 16*b* provided on the free end side from interfering with the membrane support portion 17. Free displacement of the vibration membrane 16 can thereby be tolerated. Further, the space portion 17*f* is formed such that an upper portion of the membrane support portion 17 remains. Therefore, it is possible to prevent the clearance 19 between the vibration membrane 16 and the membrane support portion 17 from becoming large. This can suppress airflow through the clearance 19.

Although the fifth to eighth embodiments have been described above, the fifth to eighth embodiments can utilize the technical features in the individual embodiments in combination with each other. In addition, the fifth to eighth embodiments can utilize the technical features in the first to fourth embodiments and in modified examples of the individual embodiments in combination with each other.

As described above, embodiments of the present disclosure have been described, but it should not be understood that the descriptions and drawings that form part of this embodiments the disclosure. Various alternative embodiments, examples and operational techniques will become apparent to those skilled in the art from this disclosure.

In addition to transmitting a sound wave, a transducer may be used for receiving a sound wave, for example. A transducer may be used for transmitting or receiving an ultrasonic wave in addition to transmitting or receiving a sound wave.

What is claimed is:
1. A transducer comprising:
a membrane support portion that includes a cylindrical inner peripheral surface which forms a hollow portion;
a vibration membrane that has a whole periphery connected to the inner peripheral surface and is displaceable in a membrane thickness direction;
a piezoelectric element that includes a pair of electrodes and a piezoelectric membrane interposed between the pair of electrodes, and is laminated on the vibration membrane; and
a dividing slit that penetrates a vibrator in which the vibration membrane and the piezoelectric element are laminated in a thickness direction, and divides the vibrator into a plurality of vibration regions, wherein
the inner peripheral surface has:
a polygonal shape in which a plurality of flat portions are connected via a chamfered corner portion, and
the dividing slit includes:
a main slit portion that extends from a center of the vibration membrane toward the corner portion; and
a sub-slit portion that extends from a connecting portion which connects the corner portion and the flat portions, to an end portion of the main slit portion on a side of the corner portion.

2. The transducer according to claim 1, wherein
the piezoelectric element includes:
a piezoelectric slit that penetrates the piezoelectric element in a thickness direction and extends from the flat portions to the dividing slit along a vertical direction of the flat portions.

3. The transducer according to claim 1, wherein
each of the pair of electrodes is connected to a circuit pattern for applying a driving voltage to the electrodes in each of the plurality of vibration regions.

4. The transducer according to claim 1, wherein
the piezoelectric element includes an opening portion in a region corresponding to a-t center of the vibration membrane, the opening portion allowing the piezoelectric element to penetrate in a thickness direction.

5. The transducer according to claim 1, wherein
the plurality of vibration regions include:
a first vibration region, and
a second vibration region that is divided into a shape different from a shape of the first vibration region.

6. The transducer according to claim 1, further comprising:
a membrane body protective layer that is disposed on the piezoelectric element along the inner peripheral surface and protects a connecting portion between the vibration membrane and the inner peripheral surface.

7. The transducer according to claim 1, further comprising:
a cover layer that is disposed on the piezoelectric element so as to cover the dividing slit and expands and contracts in accordance with displacement of the vibration membrane.

8. The transducer according to claim 1, wherein
each of the plurality of vibration regions is chamfered such that a thickness of a distal end positioned near the center of the vibration membrane decreases from a non-center position toward the center of the vibration membrane.

9. The transducer according to claim 1, wherein
a circular projection that extends to the center of the vibration membrane is disposed at a distal end of any one of the plurality of vibration regions, and
a notch that is cut in an arc shape so as to surround the projection is disposed at a distal end of a remaining vibration region of the plurality of vibration regions other than the vibration region in which the projection is disposed.

10. A transducer comprising:
a membrane support portion that includes a cylindrical inner peripheral surface which forms a hollow portion;
a vibration membrane that has a whole periphery connected to the inner peripheral surface and is displaceable in a membrane thickness direction;
a piezoelectric element that includes a pair of electrodes and a piezoelectric membrane interposed between the pair of electrodes, and is laminated on the vibration membrane; and
a dividing slit that penetrates a vibrator in which the vibration membrane and the piezoelectric element are laminated in a thickness direction, and divides the vibrator into a plurality of vibration regions, wherein
the inner peripheral surface has a polygonal shape in which a plurality of flat portions are connected via a corner portion,
the dividing slit extends from a center of the vibration membrane toward the corner portion, and
the piezoelectric element includes a piezoelectric slit that penetrates the piezoelectric element in a thickness direction and extends from the flat portions to the dividing slit along a vertical direction of the flat portions.

\* \* \* \* \*